US012092693B2

(12) United States Patent
Adiga et al.

(10) Patent No.: US 12,092,693 B2
(45) Date of Patent: Sep. 17, 2024

(54) SYSTEM AND METHOD FOR COMPUTING DIRECT QUADRATURE ZERO RESULTANT DRIVE VECTOR USING ROTOR POSITION

(71) Applicant: Tektronix, Inc., Beaverton, OR (US)

(72) Inventors: Parjanya Adiga, Bengaluru (IN);
Niranjan R. Hegde, Siddapur (IN);
Krishna N H. Sri, Bengaluru (IN);
Gary J. Waldo, Hillsboro, OR (US);
Yogesh M. Pai, Bengaluru (IN)

(73) Assignee: Tektronix, Inc.

( * ) Notice: Subject to any disclaimer, the term of this patent is extended or adjusted under 35 U.S.C. 154(b) by 0 days.

(21) Appl. No.: 17/849,577

(22) Filed: Jun. 24, 2022

(65) Prior Publication Data

US 2022/0413051 A1    Dec. 29, 2022

(30) Foreign Application Priority Data

Jun. 24, 2021   (IN) .............................. 202121028387

(51) Int. Cl.
  *G01R 31/34*      (2020.01)
  *H02P 6/18*       (2016.01)
  *H02P 21/18*      (2016.01)
  *H02P 25/026*     (2016.01)
  *H02P 27/08*      (2006.01)

(52) U.S. Cl.
  CPC .............. *G01R 31/343* (2013.01); *H02P 6/18* (2013.01); *H02P 21/18* (2016.02); *H02P 25/026* (2013.01); *H02P 27/08* (2013.01); *H02P 2207/05* (2013.01)

(58) Field of Classification Search
  CPC ........ G01R 31/34; G01R 11/20; G01R 25/00; G01R 27/00; G01R 29/18; H02P 21/00; H02P 6/34; H02P 27/06; H02P 21/0003
  See application file for complete search history.

(56) References Cited

U.S. PATENT DOCUMENTS

| 2010/0017063 | A1  | 1/2010  | Maeda |
| 2019/0329817 | A1  | 10/2019 | Takase et al. |
| 2020/0001915 | A1* | 1/2020  | Ghaderi ................... H02P 6/08 |
| 2021/0013818 | A1  | 1/2021  | Vasudev et al. |

FOREIGN PATENT DOCUMENTS

| CN | 101355337 A | * | 1/2009 |
| JP | 2000102299  |   | 4/2000 |
| JP | 2020043719  |   | 3/2020 |

OTHER PUBLICATIONS

Korean Intellectual Property Office, International Search Report and Written Opinion for International Application PCT/US2022/035026, Oct. 21, 2022, 10 pages, Daejeon, Republic of Korea.

* cited by examiner

*Primary Examiner* — Said Bouziane
(74) *Attorney, Agent, or Firm* — Miller Nash LLP; Andrew J. Harrington

(57) ABSTRACT

A test and measurement instrument includes one or more sensors configured to measure a mechanical position of a synchronous machine driven by analog three-phase signals, a converter to determine an instantaneous electrical angle from the measured mechanical position, a transform configured to generate DQ0 signals based on the instantaneous electrical angle, and a vector generator structured to produce a resultant vector from the DQ0 signals. Methods are also described.

26 Claims, 21 Drawing Sheets

| IMDA Meas 1: DQ0[1] | | | 1/2/5 |
|---|---|---|---|
| | D | Q | Z |
| RMS: | 4.991 V | 13.05 V | 234.6 mV |
| Pk-Pk: | 74.69 V | 53.81 V | 378.1 mV |
| Mean: | 992.6 mV | 7.521 V | 229.5 mV |
| Mag(D, Q): | 7.342 V | | |
| Hits: | 78 | | |

SYSTEM AND METHOD FOR COMPUTING DIRECT QUADRATURE ZERO RESULTANT DRIVE VECTOR USING ROTOR POSITION

CROSS-REFERENCE TO RELATED APPLICATIONS

This disclosure claims benefit of Indian Provisional Application No. 202121028387, titled "A System and Method for Computing Direct Quadrature Zero Resultant Drive Vector Using Rotor Position," filed on Jun. 24, 2021 the disclosure of which is incorporated herein by reference in its entirety.

TECHNICAL FIELD

The present disclosure relates to test and measurement systems, and, more particularly, to a test and measurement system for measuring and displaying measurement information about electric motor operation and other synchronous machines.

BACKGROUND

A representation of Direct Quadrature Zero (DQ0) information helps a user test and measure information about motor operation and other synchronous machines. Specifically, the DQ0 is a transform that rotates reference frames of Alternating Current (AC) waveforms to convert them into Direct Current (DC) signals. Operations on these DC signals simplify an analysis of the performance of synchronous machines, such as motors.

Although presenting information of a DQ0 vector allows the user to determine location and other information about the DQ0 vector, present systems lack any ability to analyze DQ0 vectors of motors and synchronous machines as they vary over time, especially variations due to dynamic loads, as the DQ vectors are not correlated to the actual real-time position of the rotor magnets in the motor.

Embodiments of this disclosure address these and other limitations of conventional test and measurement systems.

BRIEF DESCRIPTION OF ACCOMPANYING DRAWINGS

FIGS. 13, 14A, 14B, and 15 illustrate combined phasor and waveform diagrams, according to an exemplary implementation of the present disclosure.

Figure 17:
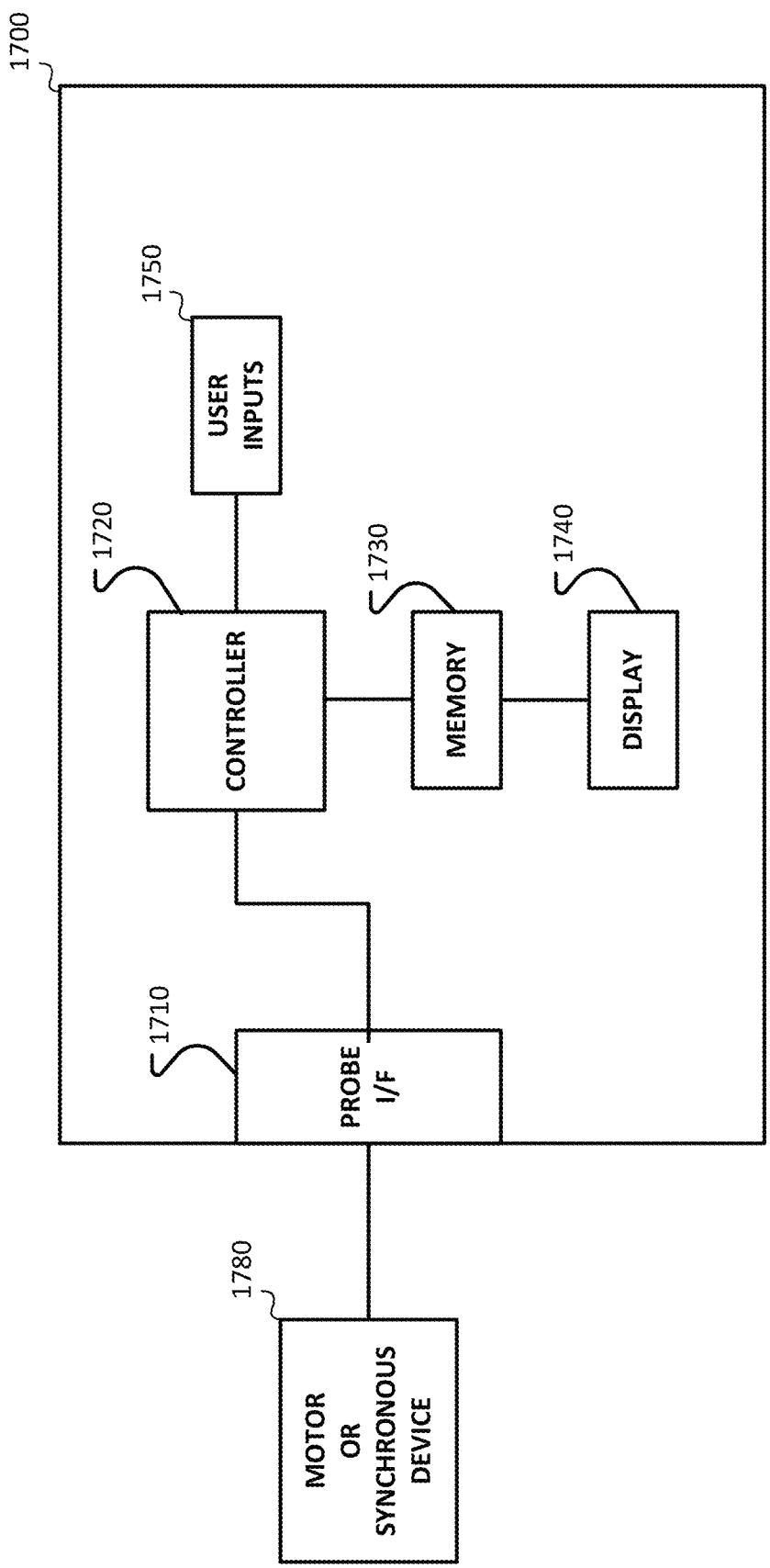

FIG. 16 is an example scalar output that may be presented to the user in addition to the phasor and waveform diagrams, according to an exemplary implementation of the present disclosure FIG. 17 is a block diagram illustrating functional blocks of a test and measurement device including a system and method for computing direct quadrature zero resultant vectors using the rotor position according to an exemplary implementation of the present disclosure.

Figure 18A:
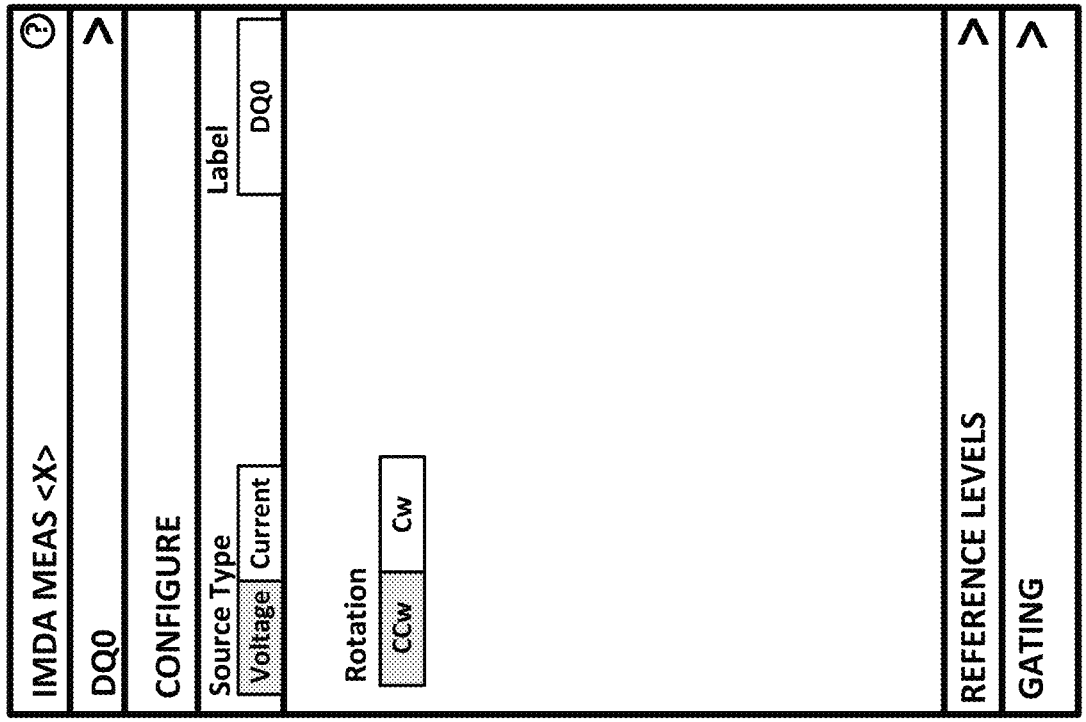
Figure 18B:
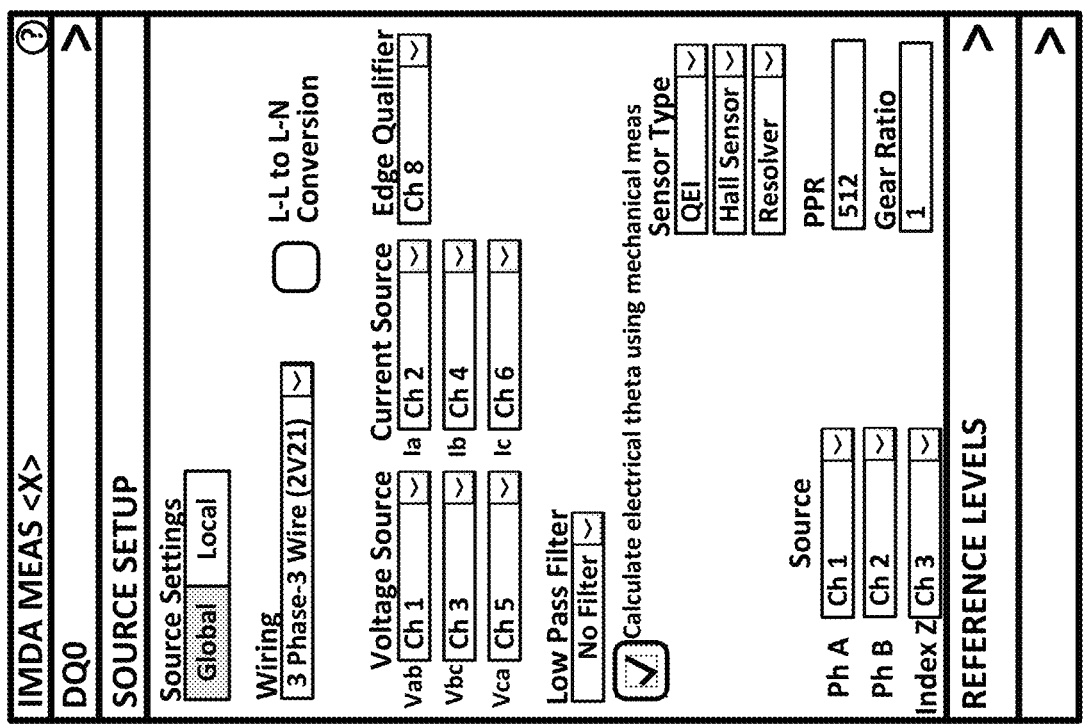

FIGS. 18A and 18B illustrate example configuration screens a user may operate to set up and configure a test system incorporating direct quadrature zero resultant vectors according to exemplary implementations of the present disclosure.

Figure 19:
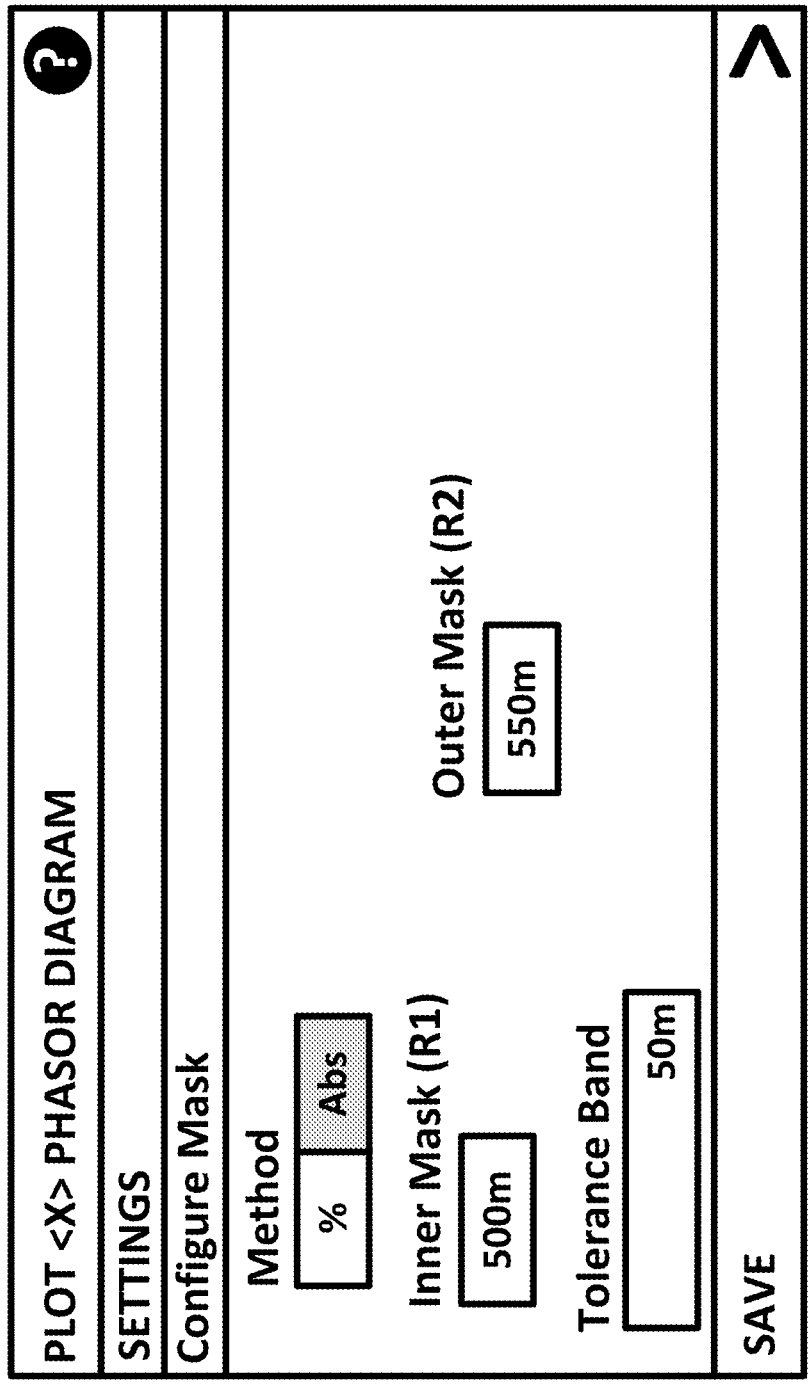

FIG. 19 illustrates an example configuration screen to configure mask settings in a test system according to an exemplary implementation of the present disclosure.

DETAILED DESCRIPTION

The various embodiments of the present disclosure describe a system and method for determining a direct quadrature zero resultant drive vector, $R_{DQ}$, using rotor position. It further provides an improved system and method for displaying and allowing user interaction with the resultant drive vector display in an industrial environment.

In the following description, for purpose of explanation, specific details are set forth in order to provide an understanding of the present disclosure. It will be apparent, however, to one skilled in the art that the present disclosure may be practiced without these details. One skilled in the art will recognize that embodiments of the present disclosure, some of which are described below, may be incorporated into a number of systems.

However, the systems and methods are not limited to the specific embodiments described herein. Further, structures and devices shown in the figures are illustrative of exemplary embodiments of the presently disclosure and are meant to avoid obscuring of the presently disclosure.

It should be noted that the description merely illustrates the principles of the present invention. It will thus be appreciated that those skilled in the art will be able to devise various arrangements that, although not explicitly described herein, embody the principles of the present invention. Furthermore, all examples recited herein are principally intended expressly to be only for explanatory purposes to help the reader in understanding the principles of the invention and the concepts contributed by the inventor to furthering the art and are to be construed as being without limitation to such specifically recited examples and conditions. Moreover, all statements herein reciting principles, aspects, and embodiments of the invention, as well as specific examples thereof, are intended to encompass equivalents thereof.

Motors consist of stator windings and a permanent-magnet rotor. The rotor spins relative to the motor body while the stator windings are stationary. The stator windings are controlled (commutated) by external electronics that generate electrical signals to drive the motor. The winding currents generated by the driving signals produce torque on the rotor by interacting with the permanent magnets of the rotor, and this keeps the motor running.

Figures 1A, 1B:
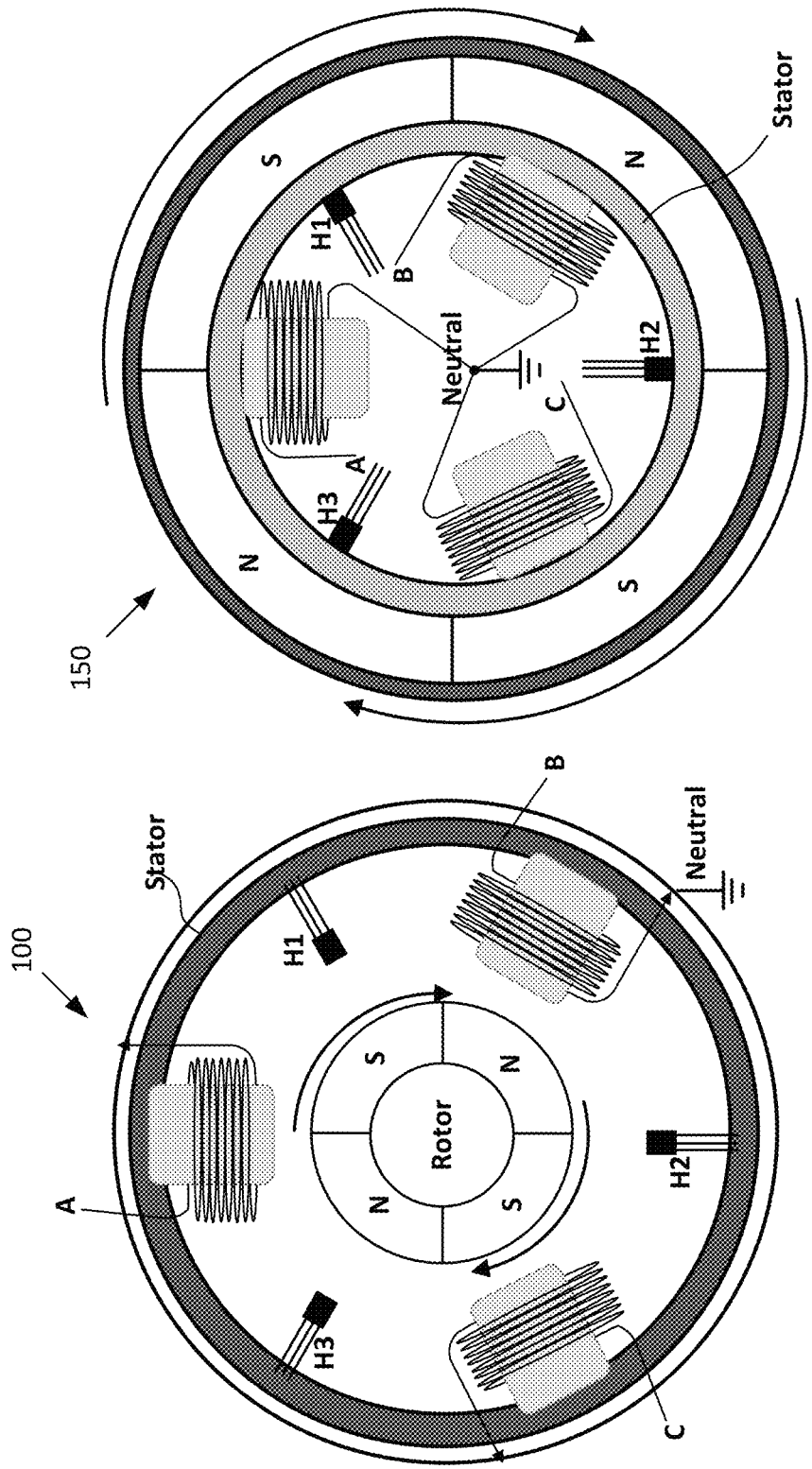
FIGS. 1A and 1B illustrates a rotor stator structure, with Hall sensors for mechanical feedback, according to an exemplary implementation of the present disclosure.

FIG. 1A is a diagram illustrating components of an in-runner motor 100, while FIG. 1B is a diagram illustrating components of an out-runner motor 150 according to embodiments of the disclosure. In this embodiment, each motor 100, 150 includes three-phase electromagnets A, B, C, and each motor includes three sensors, such as hall sensors H1, H2, and H3. Stators are also shown. The position and electrical connections to the electromagnets A, B, and C differ based on whether the motor is an in-runner or an out-runner. Electromagnet A is considered to be at 0 degrees of rotation.

A, B and C represent 3 phase electromagnets from the stator, with A considered to be at 0 degrees for representation.

Figure 2:
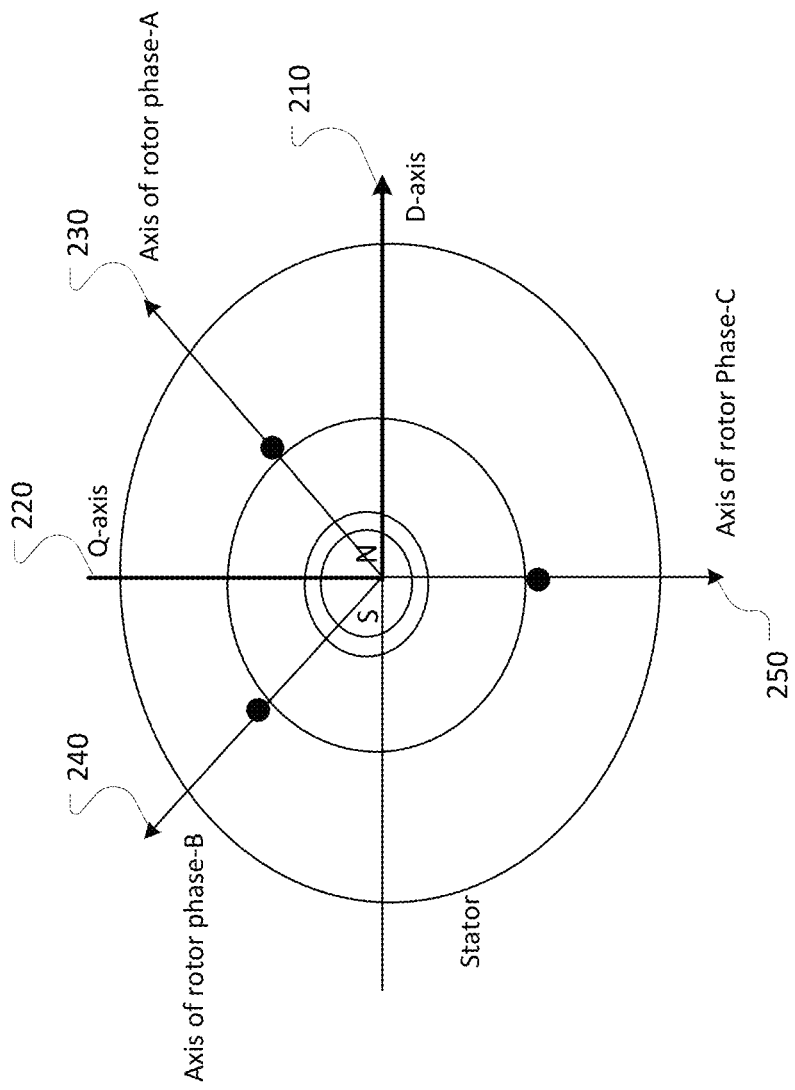
FIG. 2 illustrates a graphical diagram depicting DQ0, according to an exemplary implementation of the present disclosure.

FIG. 2 illustrates a DQ reference frame for analyzing motor operation. The DQ reference frame includes a direct (D) axis 210 and a quadrature (Q) axis 220, and is considered to be fixed to the rotor of the motor. The D-axis 210 is the axis of the field winding in the direction of a DC field applied to the motor, while the Q-axis 220 is 90 degrees offset from the D-axis. Axes of the A, B, and C rotor phase are also illustrated as Axes 230, 240, and 250. These axes are offset 120 degrees from one another. By applying the DQ0 transform, described below, the time varying inductance of the motor caused by the electrical signals that drive the motor become constants that aid analysis.

Figure 3:
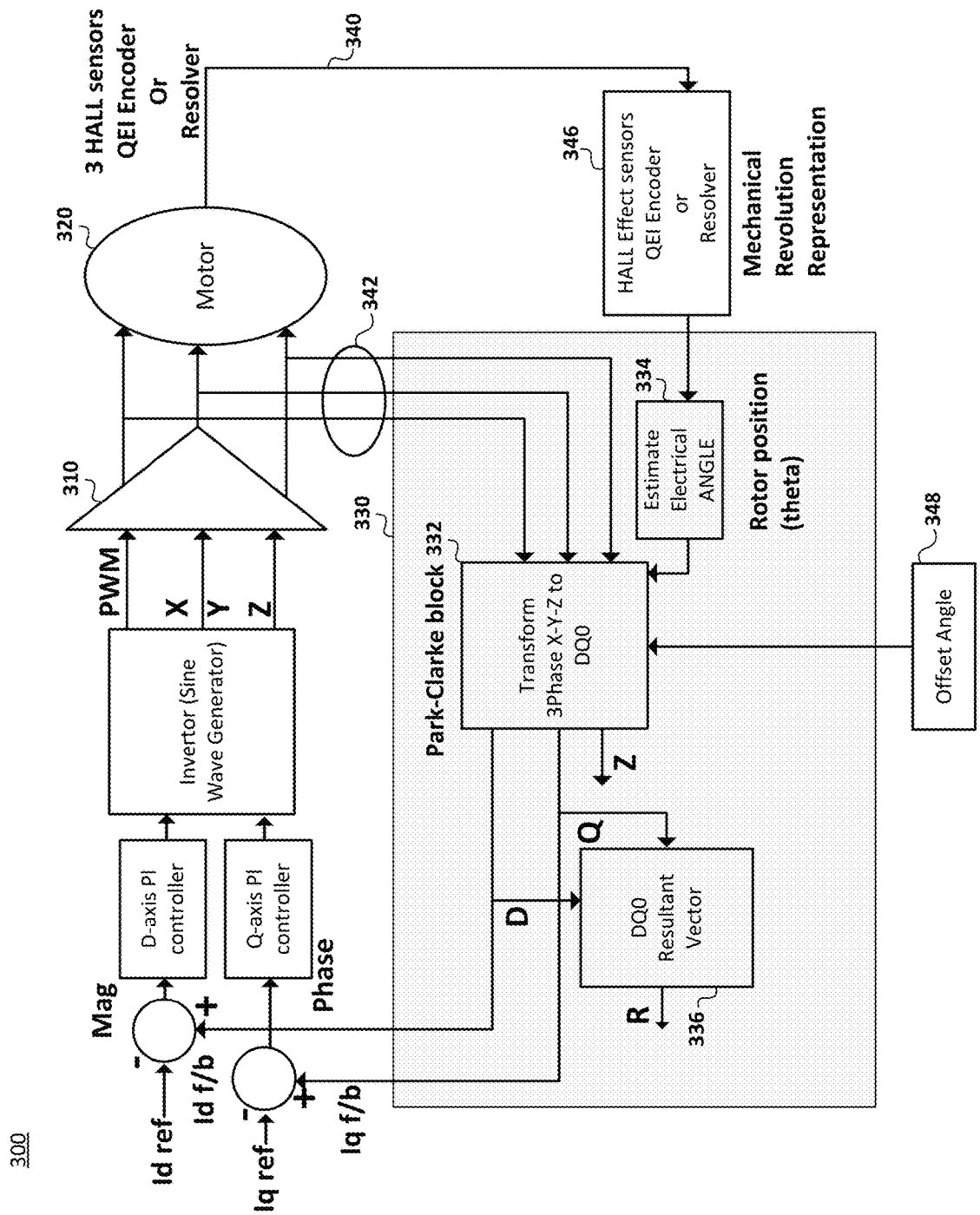
FIG. 3 is a functional block diagram illustrating components of a system for computing direct quadrature zero resultant drive vector according to an exemplary implementation of the present disclosure.

FIG. 3 is a block diagram of a vector generation circuit 300 for generating a resultant vector $R_{DQ}$ using the DQ0 transform, as described below. A driver 310 sends Pulse Width Modulation (PWM) signals X, Y, Z for driving a motor 320. A rising edge of index pulse Z is aligned to the phase A coil, which represents a 0 degree rotor angle. The PWM signals X, Y, and Z are fed to a transform function 332 within a Park-Clarke block 330. The PWM signals X, Y, and Z may be representative of either current or voltage. As described below, in embodiments of the disclosure, information 340 about the mechanical aspects of the spinning motor 320, as generated through either Hall effect sensors, a Quadrature Encoder Interface (QEI), or a resolver, may also be provided to give mechanical feedback about the motor rotation that may be used in conjunction with the electrical aspects to provide additional information to the user.

In general, the DQ0 transform block receives three-phase voltage or three-phase current signals from the driver 310 and applies a matrix transformation to produce DC DQ0 waveforms. The Park-Clarke block 330 performs both Clarke and Parke transforms to form the DQ0 transform.

Then, the transform matrix, described below, converts the time-varying AC signals into time-invariant DC components. The Park-Clarke block 330, or any of the sub-blocks 332, 334, and 336, may be embodied using specialized hardware, or software running on a special purpose or general purpose processor.

For aligning the A-phase, i.e., the phase of the A coil, to the D-axis, the below transform is used:

Equation (1)
$$\begin{bmatrix} D(t) \\ Q(t) \\ 0(t) \end{bmatrix} = \frac{2}{3} \begin{bmatrix} \cos(\theta ele) & \cos\left(\theta ele - \frac{2\pi}{3}\right) & \cos\left(\theta ele + \frac{2\pi}{3}\right) \\ -\sin(\theta ele) & -\sin\left(\theta - \frac{2\pi}{3}\right) & -\sin\left(\theta ele + \frac{2\pi}{3}\right) \\ \frac{1}{2} & \frac{1}{2} & \frac{1}{2} \end{bmatrix} \begin{bmatrix} A(t) \\ B(t) \\ C(t) \end{bmatrix}$$

Where A, B, and C can be taken as current ($I_{A,B,C}(t)$) or voltage ($V_{AN,BN,CN}(t)$). These may be supplied to the Park-Clarke block 330 through connection lines 342.

The A(t), B(t) and C(t) signals are three-phase outputs from the driver 310. The D(t), Q(t) and 0(t) are transformed signals at each sample point, where t is sample time and starts from t=0+Δt . . . horizontal duration. Also, θele is an electrical angle determined in block 334 from inputs from three Hall sensors, QEI outputs, or resolver outputs, described below, from the motor 320.

The resultant vector of interest is determined in a block 336, which is computed as:

$$R_{DQ}(n) = \sqrt{D(n)^2 + Q(n)^2}$$ Equation (2)

Where n is a number from 0 to N−1, and where N is the total number of sample points in an acquisition.

Embodiments according this disclosure may use at least three different methods of computing the angular position of the rotor of the motor 320, a Hall sensor method, a QEI method, and a sensor method. Each method will be described in turn.

In the Hall method embodiment, in general, one or more Hall sensors detect a magnetic field and outputs an analog signal proportional to its magnitude. For example, in the case of a 2-pole motor, it is possible to detect the rotor position every 60 degrees by arranging three Hall sensors at 120-degree intervals on the side of the stator that faces the magnetic pole of the rotor.

With reference back to FIGS. 1A and 1B, each illustrated motor 100, 150 includes three Hall sensors, H1, H2, and H3, which are located 120 degrees offset from one another, and located mid-way between adjacent three-phase electromagnets A, B, and C. A Hall sensor, or Hall effect sensor, detects the presence and magnetic field using the Hall effect. In general, Hall sensors generate an electrical signal representative of the instantaneous electric field surrounding the sensor itself.

Thus, as the motors 100, 150 spin, the Hall sensors H1, H2, and H3 measure the magnetic fields and generate electrical signals representative of the strength of the magnetic fields.

Figure 4:
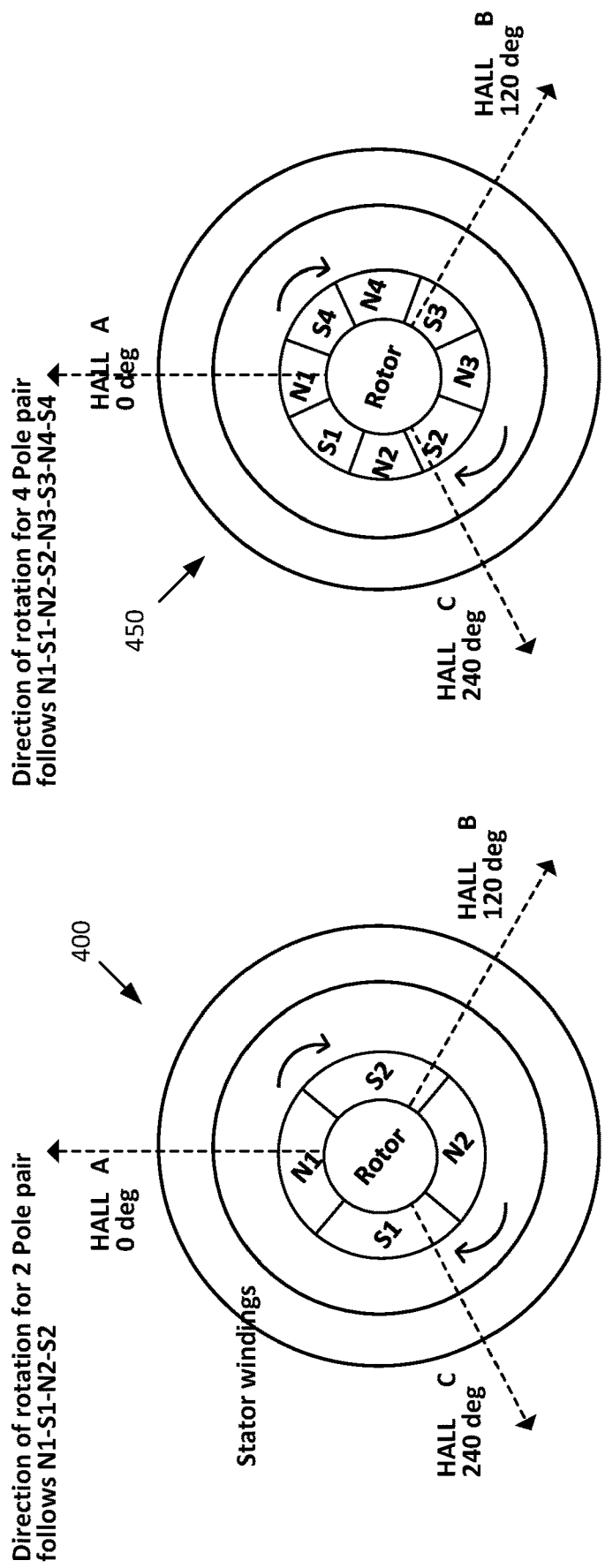
FIG. 4A illustrates a two pole-pair (four pole) motor including Hall sensors for mechanical feedback, according to an exemplary implementation of the present disclosure.
FIG. 4B illustrates a four pole-pair (eight pole) motor including Hall sensors for mechanical feedback, according to an exemplary implementation of the present disclosure.

FIGS. 4A and 4B illustrate how the Hall sensors may be used in embodiments of the disclosure. FIG. 4A illustrates a two pole-pair (four pole) motor 400 having a clockwise direction. In this motor 400 there are four rotor magnetic fields, N1, N2, S1, and S2. The stator windings of the motor 400 surround the rotor magnets that generate the magnetic fields. A motor 450 illustrated in FIG. 4B is a four pole-pair (eight pole) motor having eight magnetic fields, N1, N2, N3, N4, S1, S2, S3, and S4. Hall sensors Hall A, Hall B, and Hall C, are statically arranged 120 degrees apart from one another, and mounted at angles of 0, 120, and 240 degrees, respectively. When one of the rotor magnets crosses a Hall axis, the magnet and the Hall sensors will be in alignment. With reference to FIG. 4A, N1 produces a rising edge in the Hall sensor A when it crosses the sensor. After 120 degrees of mechanical angle delay, N1 then crosses the Hall B sensor. So, when the Hall B sensor gives a rising edge due to this crossing, it means that the rotor angular position has shifted 120 degrees from the 0 reference point. In an eight-pole motor 450, such as in shown in FIG. 4B, the eight magnets N1-S1-N2-S2-N3-S3-N4-S4 will cross the Hall sensors twice as fast (2×) compared to four-pole motor 400, when running at same mechanical speed.

Figure 5:
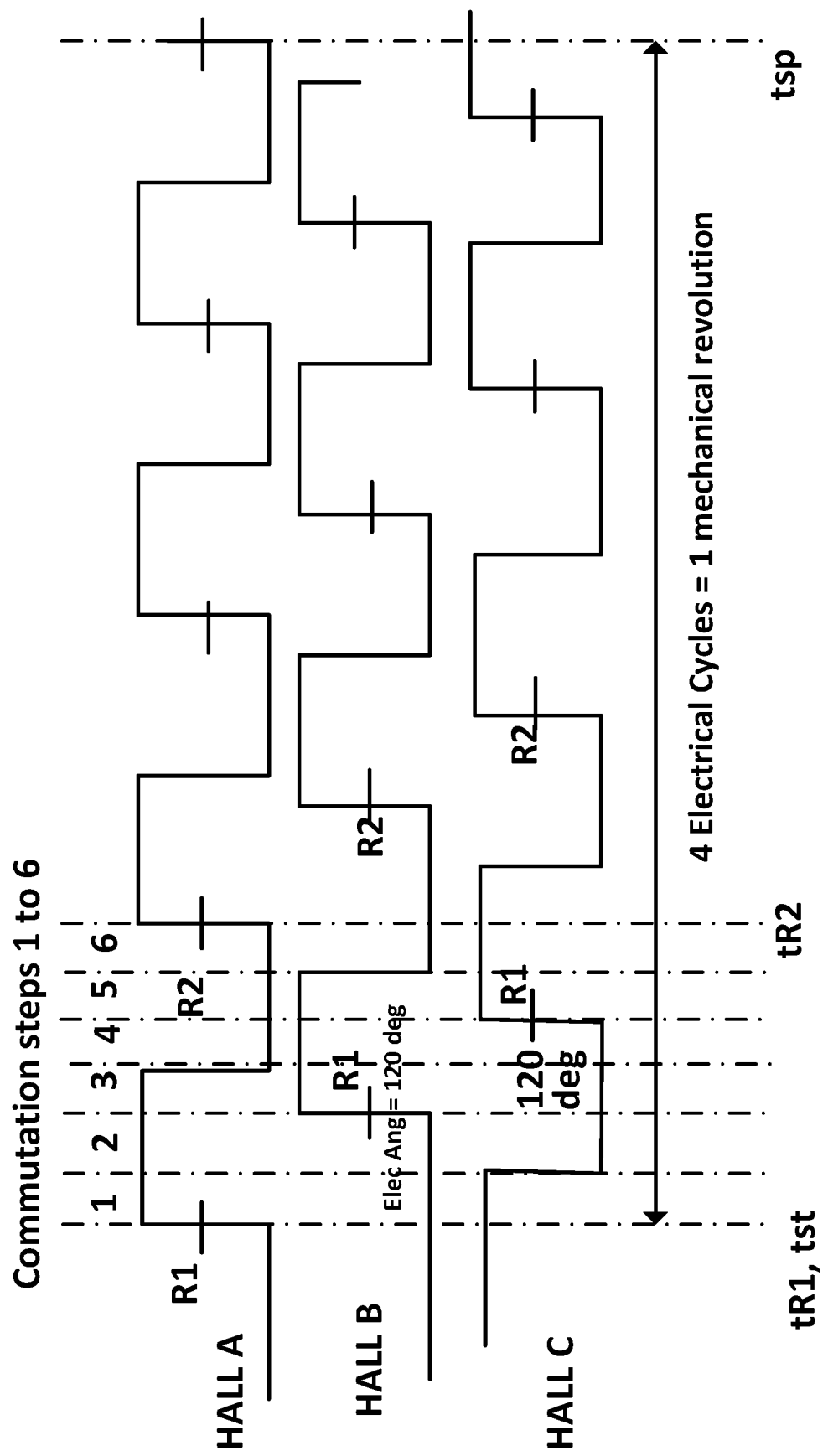
FIG. 5 is a graph depicting Hall sensor transitions, according to an exemplary implementation of the present disclosure.

FIG. 5 is a graph illustrating rising and falling edge transitions of the Hall sensor outputs H1, H2, and H3, of either of the motors 400, 450 of FIGS. 4A and 4B. Table 1 shows the angle of rotation of the rotor, as referenced from 0 degrees, as the motor spins an entire revolution. Also illustrated in Table 1 are the states of the Hall A, Hall B, and Hall C sensors, as well as its correlated commutation step illustrated in FIG. 5. With reference to FIG. 5 and Table 1, there are six commutation steps. For a four-pole-pair motor, there will be four electrical cycles, each of six commutation steps, for each single mechanical revolution of the motor. This is typical for a Brushless DC (BLDC) motor and related motor drives.

TABLE 1

| Electrical Angle (deg) | Hall state | Commutation Step |
| --- | --- | --- |
| 0-60 | (1, 0, 1) | 1 |
| 60-120 | (1, 0, 0) | 2 |
| 120-180 | (1, 1, 0) | 3 |
| 180-240 | (0, 1, 0) | 4 |
| 240-300 | (0, 1, 1) | 5 |
| 300-360 | (0, 0, 1) | 6 |

By evaluating the rising and falling edges from each Hall sensor output, the relative mechanical angle of the motor at any time can be arrived determined. Each electrical cycle of the motor, or motor driving circuit, can be considered as 360 degrees. With three Hall sensor outputs, a six-step commutation is generated. So, the rotor angle between any two consecutive edges of Hall sensor output is 60 degrees.

If Hall sensor A is taken as reference in FIG. 5, then each rising edge of the Hall A output will correspond to 0 degrees electrical angle. Since this is in the electrical domain, this will not be specific to any of the rotor magnets. In other words, each of the magnets crossing the Hall A sensor will generate a rising pulse. And, when the motor is running, it is difficult to say which magnet the Hall sensor H1 rising edge corresponds to. Embodiments according to this disclosure determine which pole is aligned with which Hall sensor using a back electro-motive-force (EMF) determination.

Motors and generators are very similar, and generally have the same construction. Generators convert mechanical energy into electrical energy, whereas motors convert electrical energy into mechanical energy. When the coil of a motor is turned ON, magnetic flux changes, and an EMF is induced, causing the motor to spin. The motor thus acts as a generator whenever its rotor rotates. This will happen whether the shaft is turned by an external input, like a belt drive, or by the action of the motor itself. That is, when a motor is doing work and its shaft is turning, an EMF is generated. According to Lenz's law, the input EMF that powers the motor will be opposed by the motor's self-generated EMF, called the back EMF of the motor, since it opposes the EMF input to the motor.

To generate back EMF with a motor, the motor is caused to mechanically rotate, generating electrical signals in the control circuit. In other words, the user mechanically forces the rotor to spin and captures electrical signals generated by such spinning.

Figure 6:
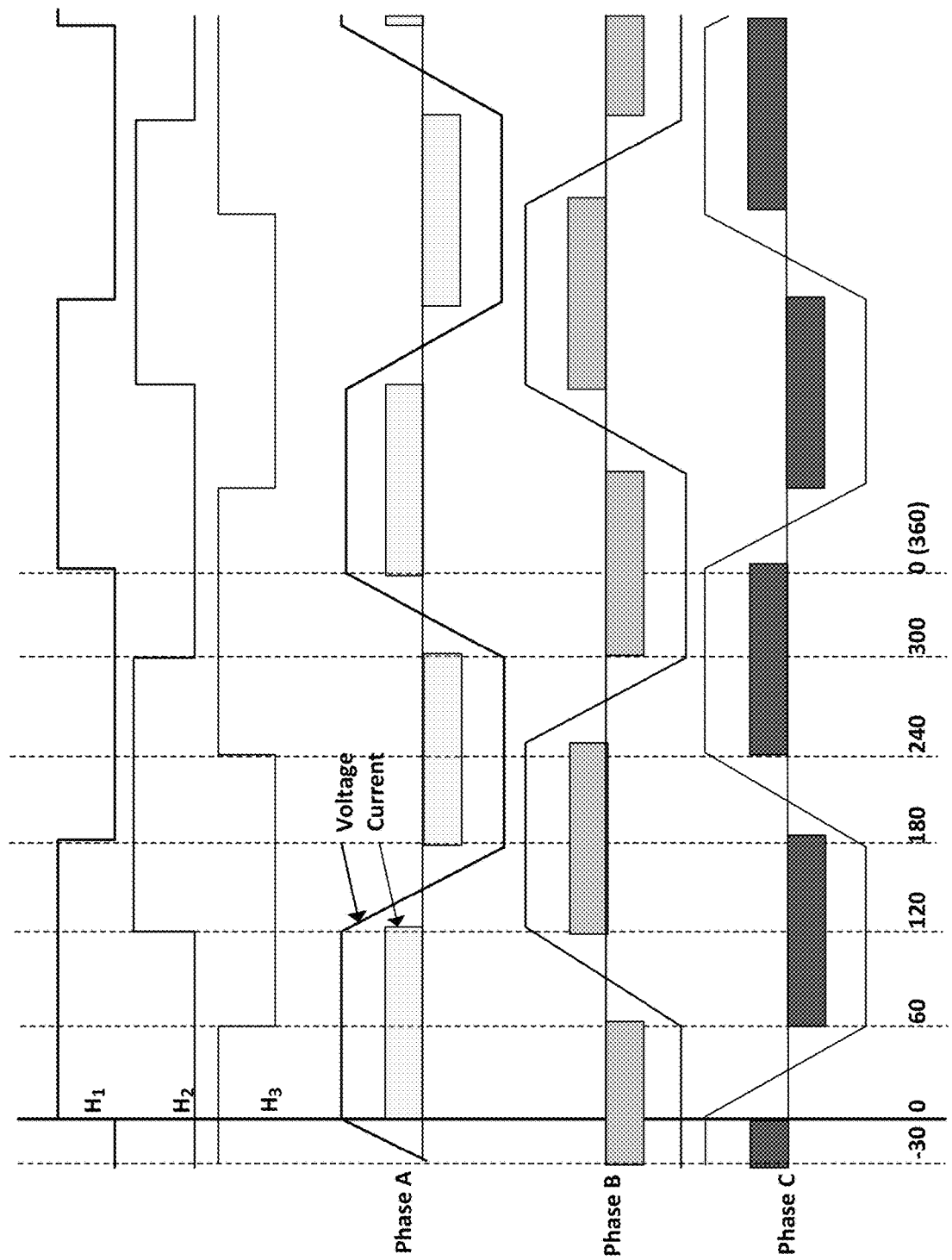
FIG. 6 is a graphical representation depicting A-B-C Phase Back EMF and comparison, with Hall sensor signals, according to an exemplary implementation of the present disclosure.

FIG. 6 illustrates captured back EMF signals caused by spinning the motor in the form of A-B-C phases generated respectively by the electromagnets A, B, and C of FIGS. 1A and 1B. FIG. 6 also shows this back EMF aligned with the Hall sensor outputs. Analyzing the Hall sensor H1 signal aligned with back EMF of the A-phase shows that, in this diagram, it is aligned with the A-magnet position, that is, starting at 0 degrees.

After it is determined which phase is aligned with the selected Hall sensor signal, embodiments of the disclosure can determine an electrical angle of interest, or rotor position, computed from the three Hall sensor signals. This computed angle represents the electrical angle, θele, which may be determined from the mechanical angle using pole pairs as described above. In the Hall sensor method of angle determination, the Hall A, B and C outputs are captured along with three voltage or current signals from the drive, as illustrated in FIG. 3. From the Hall sensor signal inputs, the rotor position (electrical angle) at any state of motor can be arrived at.

As described above, based on the number of pole pairs in the motor, several electrical cycles make up one mechanical cycle. For example, if motor is made up of 2 pole-pairs, 2 electrical cycles make up one mechanical cycle. That is, when mechanical angle increases from 0 to 360 degrees, the electrical angle changes from 0 to 360 degrees twice. Thus, for example, for a mechanical angle of 250 degrees, the electrical angle can be determined by multiplying the mechanical angle by the number of pole pairs in the motor. In this example, the electrical angle will be 250*2=500 degrees, which also represents 140 degrees (500 degrees modulo 360).

In general, electrical angle can be determined by:

$$\theta\text{ele} = (\text{number of pole pairs} * \theta m)\% \ 360 \text{ degrees}. \quad \text{Equation (3)}$$

Where % is the modulo function.

With reference back to FIG. 3, the mechanical angle of the motor at any sample point is determined in the block 334, or prior to entering the block 334, in a block 346, using the techniques described above. In the Hall effect method of determining rotor position, the inputs to the block 346 the outputs of the Hall sensors, which determine the mechanical angle of the motor. Then, the output of the block 334 is the encoder theta output, which is θele, determined using Equation 3 above, which is then used by the transform block 332 to implement Equation 1 described above.

When using the Hall sensor embodiment, angular resolution can be improved by a great extent using interpolation, or a 2nd order polynomial approach based on the number of samples in a commutation step. In general, the rotation of the DQ0 is based on the number of pole pairs in the motor. The pulsing speed generated by a four-pole pair motor is higher than that of a two-pole pair motor for the same motor speed.

Further, to simplify the setup, the user can identify the direction of rotation of the motor, clockwise or anti-clockwise, which can save a calculation step of the system determining the rotation direction.

This information provided by the user helps in giving a better resolution, and analysis can be done at each time point, rather than on the discreet time points at the Hall sensor edges.

Alternatively to the Hall effect method, embodiments according to the disclosure may use QEI method, which determines a rotor position of the motor using an encoder. A QEI encoder is also known as an incremental or optical encoder. This type of rotor determination by QEI is commonly used in Permanent Magnet Synchronous Motor (PMSM) motors.

In the QEI method embodiment, the system determines the shaft position of a motor by using an incremental encode with a combination of PhA, PhB and Index Z pulses. In this method, the Z pulse, or initialization pulse, occurs once per revolution and is used as a reference to establish an absolute rotor position. This index pulse resets position counter at zero phase of the rotor magnet. Thereafter the pulses A or B are counted based on pulses per revolution.

Figure 7:
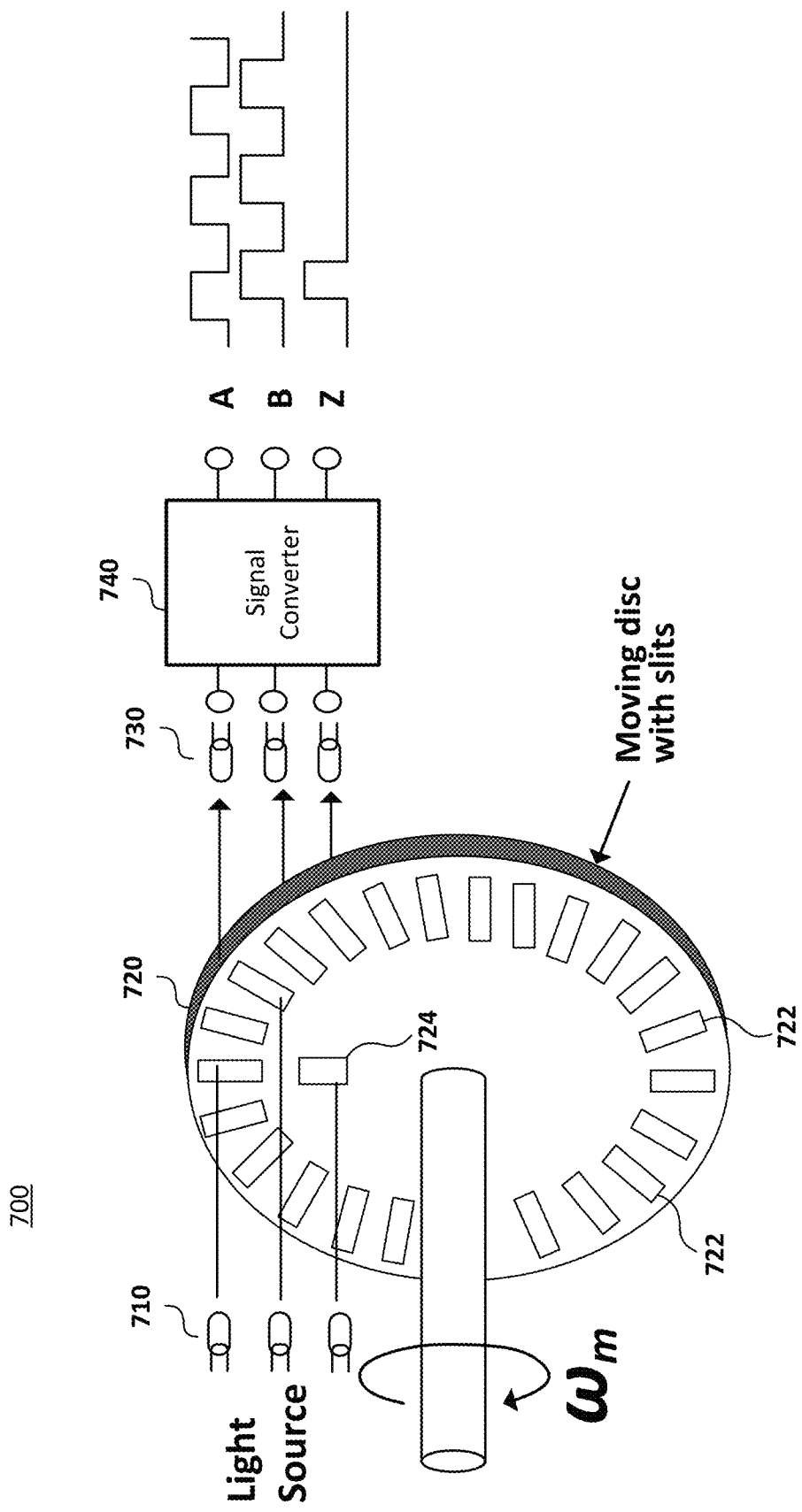
FIG. 7 is a schematic diagram depicting an optical decoder component of a QEI functional block, according to an exemplary implementation of the present disclosure.
Figure 8:
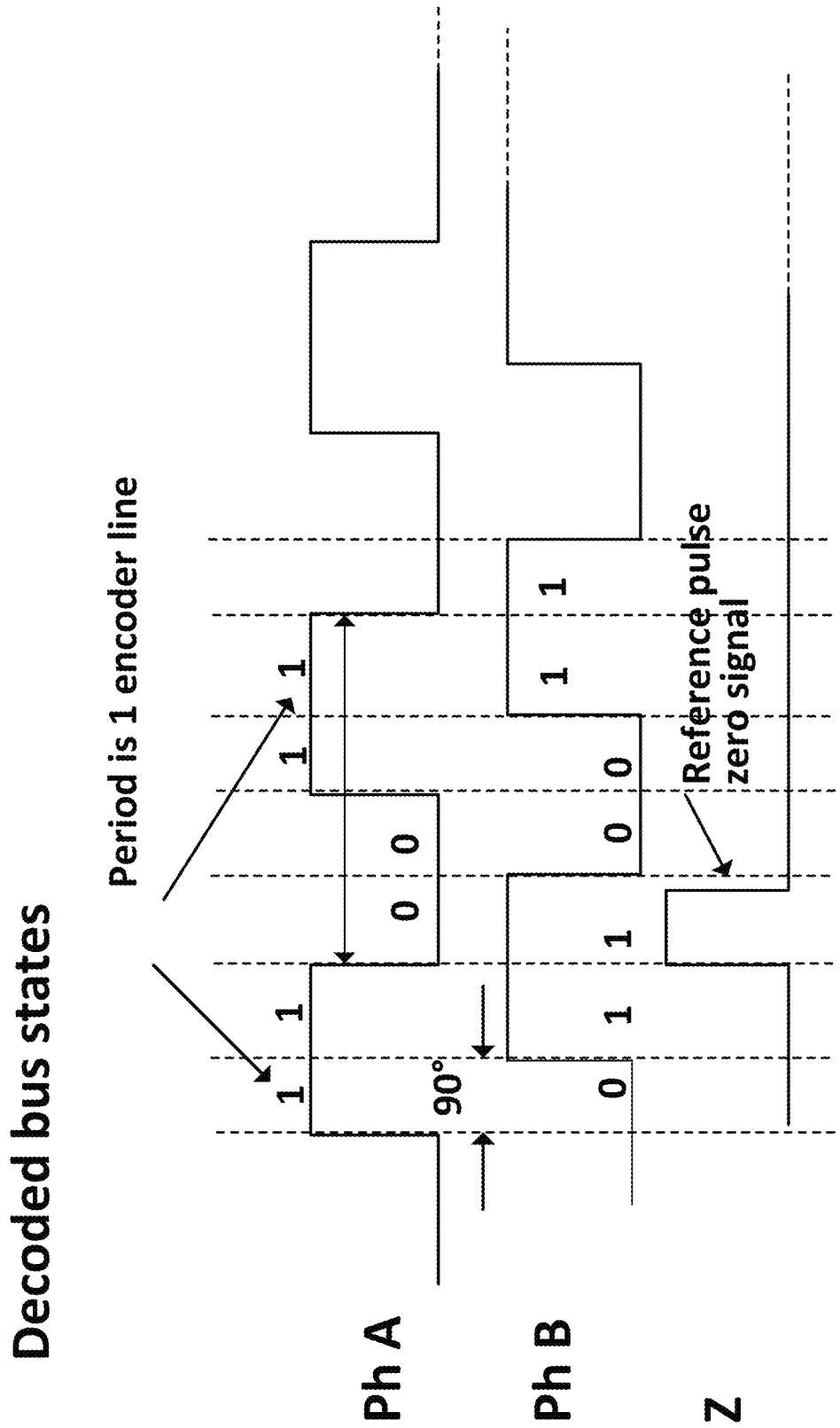
FIG. 8 is a graph depicting QEI transitions generated by the optical decoder component of FIG. 7, according to an exemplary implementation of the present disclosure.

In this QEI embodiment, illustrated in FIG. 7, an optical encoder 700 generates three signals, Phase A, Phase B and index pulse (Z) as shown in FIG. 8. These pulses are used by the QEI system to determine the instantaneous position of a rotor.

The basic components of the optical encoder 700 include one or more light sources 710, a light shutter system embodied by an encoder wheel 720, one or more light sensors 730, and signal conditioning electronics 740 that receive an output from the light sensors 730 and generate electrical signals for evaluation. The components of the optical encoder are connected to mechanical assemblies of the motor. In particular, the encoder wheel 720 spins in concert with the motor itself, and its position may be determined by evaluating the output signals.

As the motor and encoder wheel 720 spin, light from the light sources 710 is modulated by slits 722 in the decoder, which is captured by the light sensors 730. Phase A generated by the light sensors 730 consists of N pulses per revolution. Phase B is identical to Phase A, but is displaced by 90° based on the relative positions of where the light source 710 and light sensor 730 fall for Phase B. Phase Z is generated using a different slit pattern in the encoder wheel 720. Specifically, a slit 724 is aligned at 0 degrees, and only produces a single pulse per revolution of the encoder wheel 720. Thus the Phase Z signal is generated once per revolution, and set as a reference position. A positive pulse on Phase Z indicates the rotor magnet position is at 0 degrees. Encoders in the signal conditioning electronics 740 generate an electrical output from the sensor output produce Ph A, Ph B and index Z electrical pulses as shown in FIG. 7. Typical encodings for QEI produced in the signal conditioning electronics 740 include X1, X2, and X4 codings. X4 coding is the most common.

Analysis of the Ph A and Ph B signals, generated by the optical encoder 700, determines the direction of rotation of the encoder wheel, and, thus also determines the direction of rotation of the motor.

Specifically:
If Phase A leads Phase B, then the direction of the motor is clock wise or forward direction.
If Phase A lags Phase B, then the direction of the motor is counter clock wise.

Equation (4)

FIG. 8 illustrates pulses generated by the optical encoder 700 for analysis in a QEI system, according to embodiments. First, the rotor position is determined by determining an index pulse aligned with the Ph A signal. This position is considered as 0 degree. Then, using a Phase-Locked Loop (PLL), the next angle may be determined prior to the Ph B edge.

Angle in degrees is, $$\text{angle} = \frac{360/(4*PPR)}{G} * PPR_{(COUNT)} \qquad \text{Equation (5)}$$

Where PPR is pulses per revolution and '4' in Equation 5 corresponds to the encoder resolution, which, for a two-channel resolution encoder, is four. For other encoders, this value may be different. G is the gear ratio of the encoder wheel to the motor. In many cases G will equal 1.

General rotational position $(RP)=360*\text{Edge count}/\text{enc}*N$ \qquad Equation (6)

Where 'enc' accounts for the applied encoding method. Again, for two-channel encoders, the resolution is four times the line count.

For example, if we consider the PPR to be 1024, the number of pulses generated by the encoder per shaft revolution, PPR(COUNT), is the PPR at each cycle. This is a running count. Angle1 is therefore 0.70 degrees at first period, and Angle2 is ~1.4 degrees at second period and so on. Thus, Angle 1024 is 360 deg.

Figure 9:
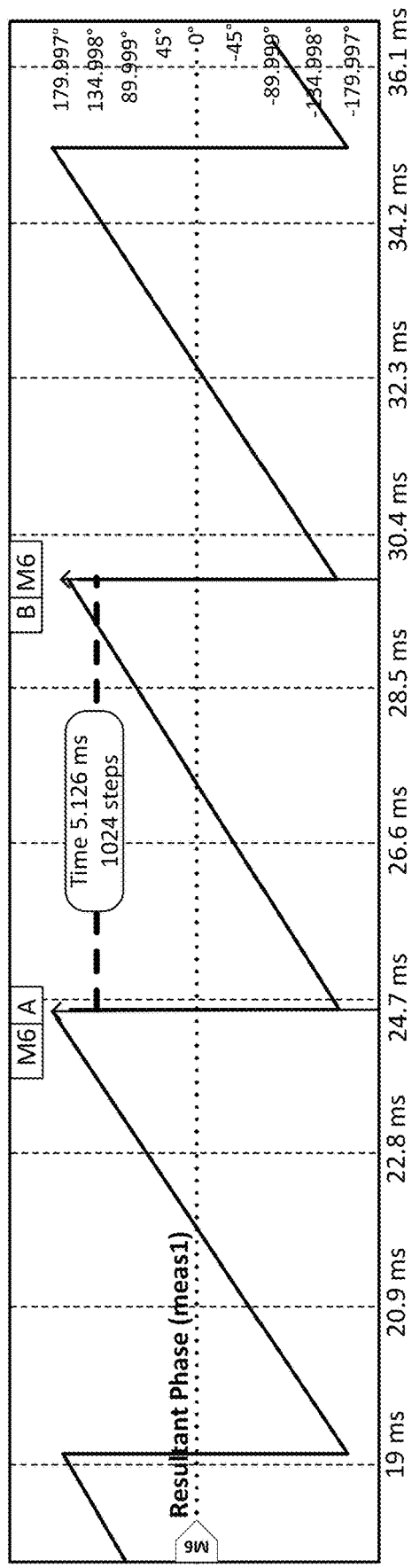
FIG. 9 is a graph depicting instantaneous angular observation for QEI transitions, according to an exemplary implementation of the present disclosure.

FIG. 9 illustrates a running Angle for all cycles. As illustrated in FIG. 9, the angle value resets to zero after one full shaft rotation, that is, at the next Z pulse index.

Resolution of embodiments using the QEI method may be improved by using step-up gearing so that one rotation of the moving object that is being monitored corresponds to several rotations of the code disk of the encoder. This improvement is directly proportional to the gear ratio of the encoder wheel 720 relative to the motor. This helps in giving a better resolution, and analysis can be done at each time point, continuously, rather than on the discreet time points at the Hall sensor edges when using the Hall sensor method.

In addition to the Hall sensor method and QEI method of determining rotor position, as described above, embodiments according to the disclosure may also use other methods of determining instantaneous rotor position. For example, a resolver system may be used. A resolver is a rotating transformer, with a primary winding on the rotor and two secondary windings on the stator of a motor. Signals generated by the resolver system include a Sine, Cosine, and other reference signals. The speed and angle of the motor relative to the stator are determined using the output signals from the resolver, which then may be used in embodiments of the invention as a mechanical revolution representation in block 346 of FIG. 3.

With either the Hall sensor embodiment the QEI method embodiment, or the resolver embodiment, embodiments of the invention may provide a DQ0 offset that may be configured by the user. Generally, there can be small angle errors while mounting sensors on motor, resulting in small misalignments. These errors can affect the computation of the vectors D, Q, and the resultant vector $R_{DQ}$. The combination of the DQ0 and $R_{DQ}$ vectors may be referred to as a DQ0-R plot. To compensate for this error, user can specify the electrical angle in the offset configuration, which will typically be a small angle offset, and the measurement initial angle gets adjusted accordingly. The offset can be specified by the user through an offset angle compensation block 348.

With feedback angle signals, the measurement aligns with the reference angle for computation. It is the index pulse in case of QEI, and the first rising edge of Hall A in case of hall sensors. For the resolver method, signal analysis may be used. In case of sensorless systems, the edge qualifier rising edge is considered as zero. If the rising edge has an offset to the actual values known by the user, that offset can be adjusted as well, using this configuration. The offset can be computed using the back EMF method or other methods, and entered using the user input 348 (FIG. 3)

With reference back to FIG. 3, either the Hall sensor method, the QEI method, or the resolver method, described above, may be used to determine the mechanical angle of the motor in the block 346. Embodiments of the disclosure then use the mechanical angle to determine the electrical angle θele in the block 334. Then, the transform block 332 generates the D and Q vectors, and the block 336 generates the DQ0 resultant vector, $R_{DQ}$.

After the D and Q resultant vectors are generated in the transform block 332, and after the resultant vector $R_{DQ}$ is produced in the block 336, for each sample point in time, these values are cumulatively represented with persistence on a phasor diagram to the user. This output presents to the user useful information of how the motor or synchronous system being tested functions over time. Outputs of the described testing system further provide a visual representation of the motor ripple as the time progresses. This highlights the instabilities due to variation in the mechanical system in the form of a plot as the change in $R_{DQ}$ at each rotor angular position. Further, as described below, embodiments according to this disclosure provide a mechanism where a user of the disclosed system may interact with the visual representation to review particular points of interest of the test results.

Figure 10A:
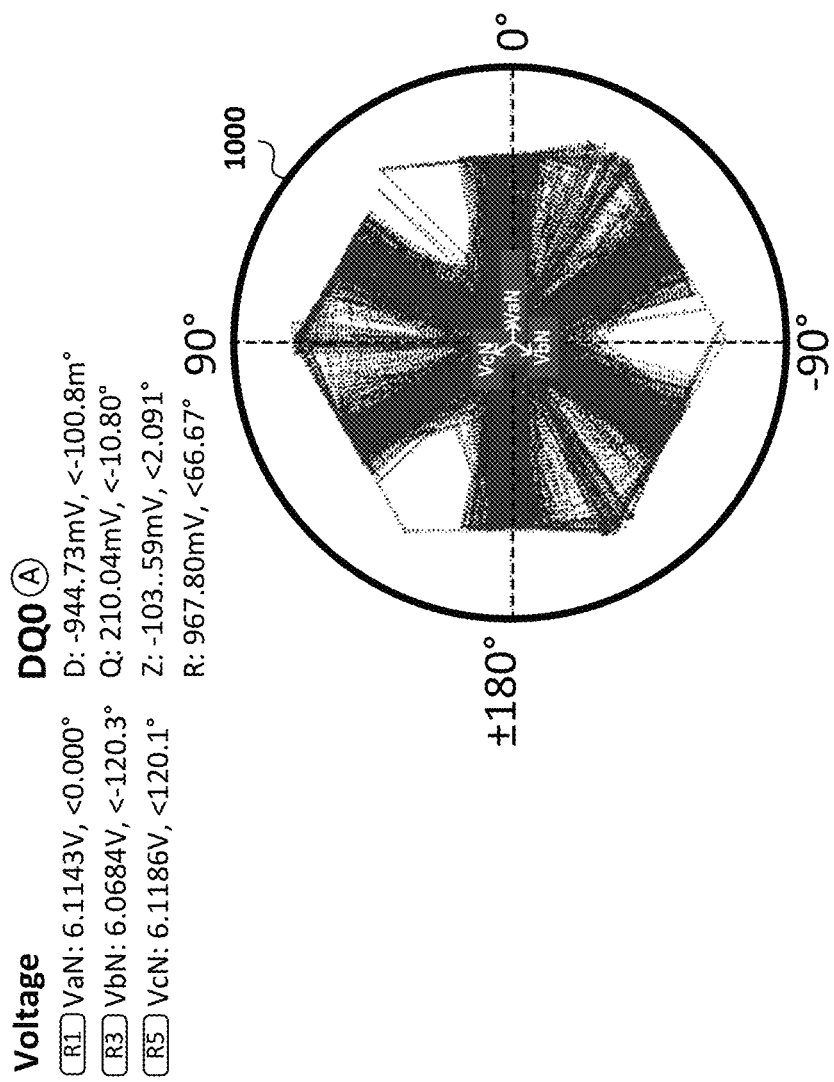
FIG. 10A is a phasor diagram illustrating DQ0 and Resultant vectors, according to an exemplary implementation of the present disclosure.
Figure 10B:
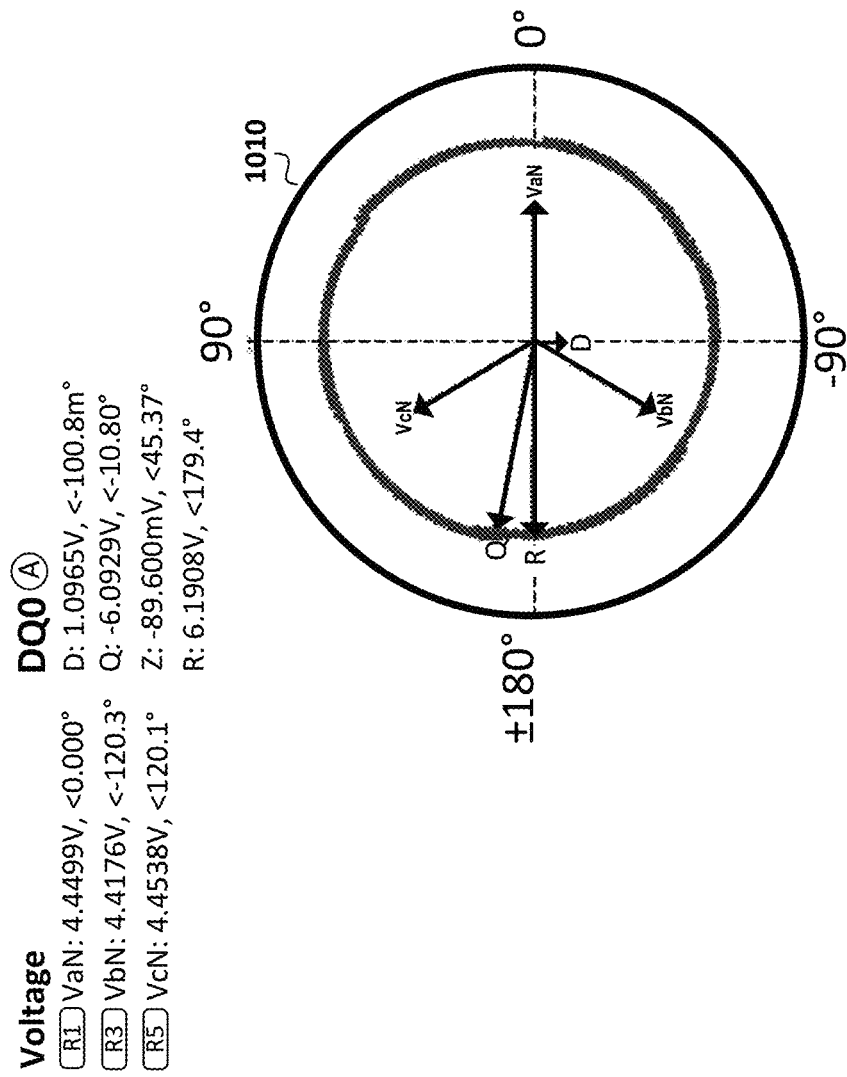
FIG. 10B is a phasor diagram illustrating filtered DQ0 and Resultant vectors, according to an exemplary implementation of the present disclosure.

FIG. 10A illustrates an example DQ0-R phasor plot, including both the D and Q vectors as well as the resultant vector $R_{DQ}$, which may be generated using embodiments of the invention. FIG. 10A may be generated by plotting the resultant vector $R_{DQ}$, generated as described above, along with the D and Q vectors illustrated in FIG. 2, for a number of sampling points over time. For example, the phasor plot 1000 of FIG. 10A may be the result of hundreds or thousands of plotted sampling points, or more. In embodiments of the invention, the data used to generate phasor plot 1000 may be passed through one or more low pass filters to remove the effects of high frequency distortion at the point of measurement due to various hardware and printed circuit board designs. There also may be voltage spikes in a measurement system due to high frequency switching converters and electro-magnetic interference (EMI) present in the signal path of motor controllers. An example plot 1010 of FIG. 10B shows the effect of passing the sources used to generate the DQ0-R phasor plot through one or more low pass filters. This low pass filter restricts the DQ0-R output to only desired frequencies. The low pass filters may be set or adjusted by the user. As the same filtering is applied to all sources, no or very low skew is introduced between sources. The example plot 1010 illustrates the benefit of using the low pass filter, as the resulting DQ0-R phasor plot 1010 is much easier to discern relevant data from the plot than the phasor plot 1000.

Figure 11:
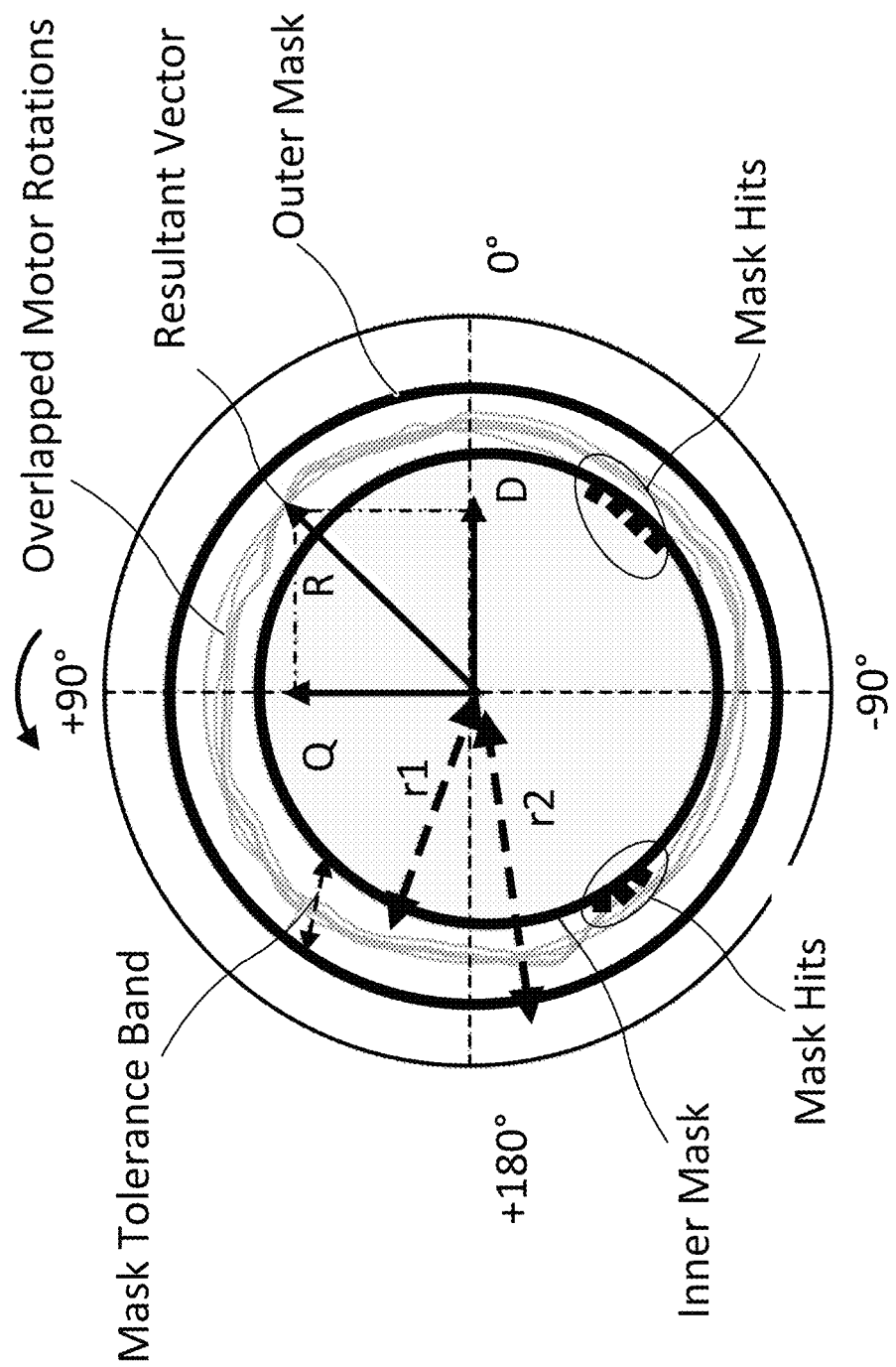
FIG. 11 is a phasor diagram including mask threshold values, according to an exemplary implementation of the present disclosure.

In addition to using a low pass filter to separate desired data from extraneous data, embodiments of the invention may also use masking to validate the rotating resultant vector $R_{DQ}$. A phasor diagram using masking is illustrated in FIG. 11. In FIG. 11, two masks are configured to bound the output—an outer mask and an inner mask. The phasor diagram of FIG. 11 illustrates overlapped motor rotations, i.e., it illustrates the trace of multiple $R_{DQ}$ vectors over time. Notice how the variations in the $R_{DQ}$ vector appear as ripples in the diagram, which indicates variations in the operation of the motor. Violations of the mask may be separately marked or indicated on the phasor diagrams as mask hits. In other words, the mask is used as a threshold detector, and when the $R_{DQ}$ falls below the inner mask, or exceeds the outer mask, the measuring system according to embodiments may generate a visual indication of this threshold violation. Violations may be shown in a contrasting color to other colors on the phasor diagram. Masks may be controlled by the user to set resultant vector limits. The DQ0-R plot represented in the phasor diagram of FIG. 11 also indicates the direction of rotation of the motor, based on the Hall sensor, QEI encoder, or resolver outputs as described above. In FIG. 11, the motor rotation is represented by rotating the $R_{DQ}$ resultant vector to match the angle of the rotor from which the $R_{DQ}$ resultant vector was determined.

Figure 12:
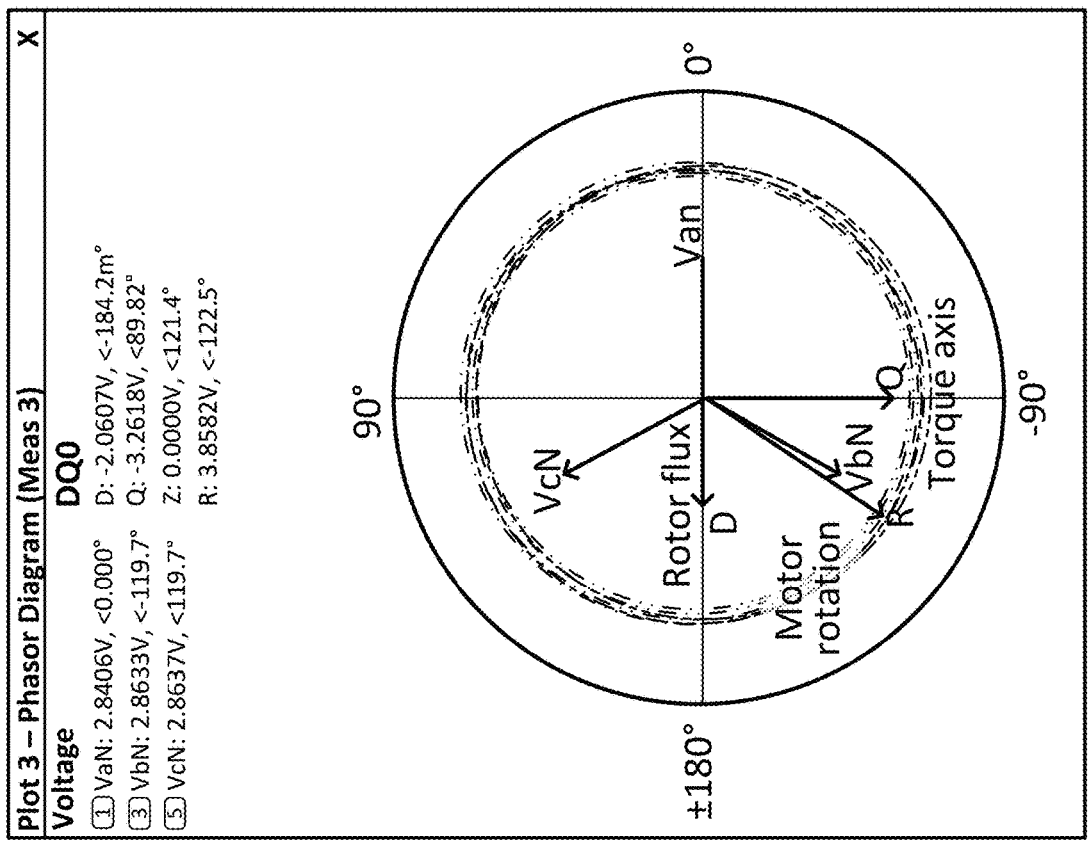
FIG. 12 is a phasor diagram illustrating flux and torque axis, according to an exemplary implementation of the present disclosure.

FIG. 12 illustrates D and Q axes in phasor diagrams, which represent motor flux and torque axes, which are orthogonal to one another, respectively. Information presented in FIG. 12 is useful to the user in examining operational features of the motor, or other synchronous system being tested.

Figure 13:
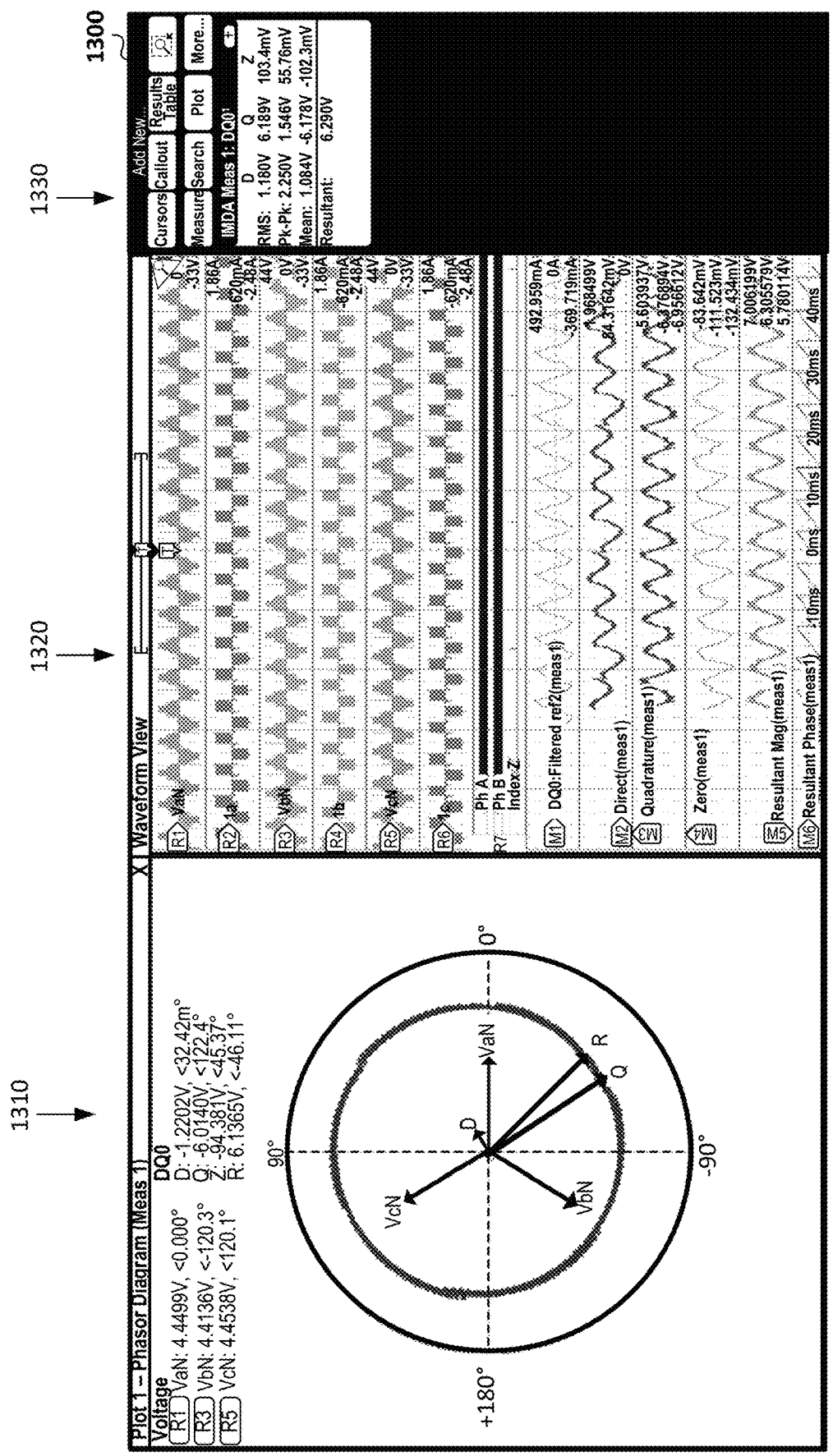

FIGS. 13-16 illustrate phasor diagrams of DQ0-R that also include data from the underlying sensing elements, calculated values, or other values determined by embodiments of the invention. In these phasor diagrams, the, D, Q and $R_{DQ}$ values from all sampled data points are shown as historical values, but the actual vectors of the plot contain only the last sample points. FIG. 13 illustrates a display 1300 including three main sections, 1310, 1320, and 1330. The section 1310 of the display shows a graphical DQ0-R that includes the D vector, Q vector, and the resultant $R_{DQ}$ vector. The section 1320 of the display shows three-phase electrical signals used to drive the motor and, optionally, as a user preference, signals that detect the mechanical position of the rotor, as described above. The section 1330 of the display may be used to show scalar results, an example of which is illustrated in FIG. 16.

Figure 14A:
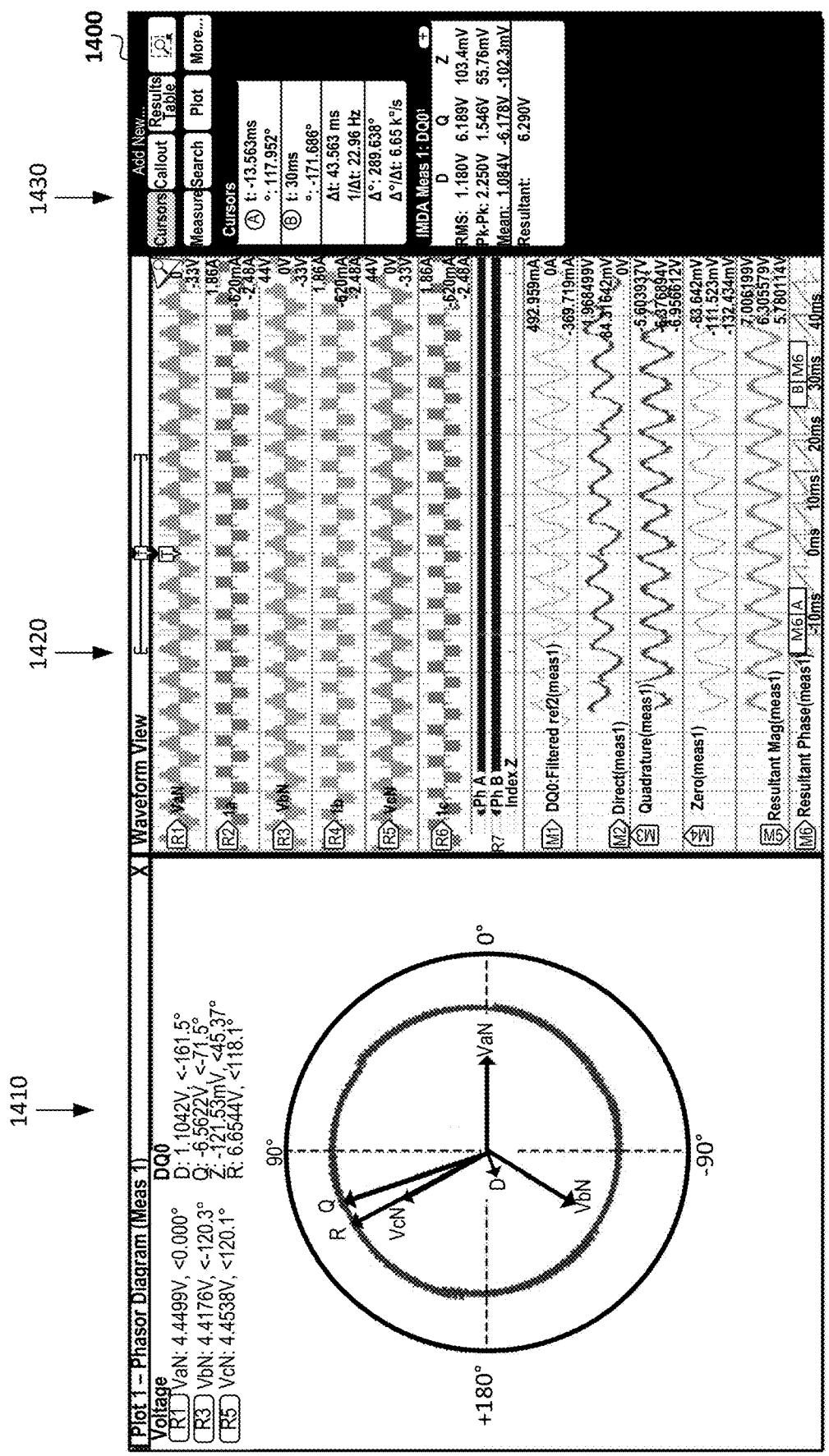
Figure 14B:
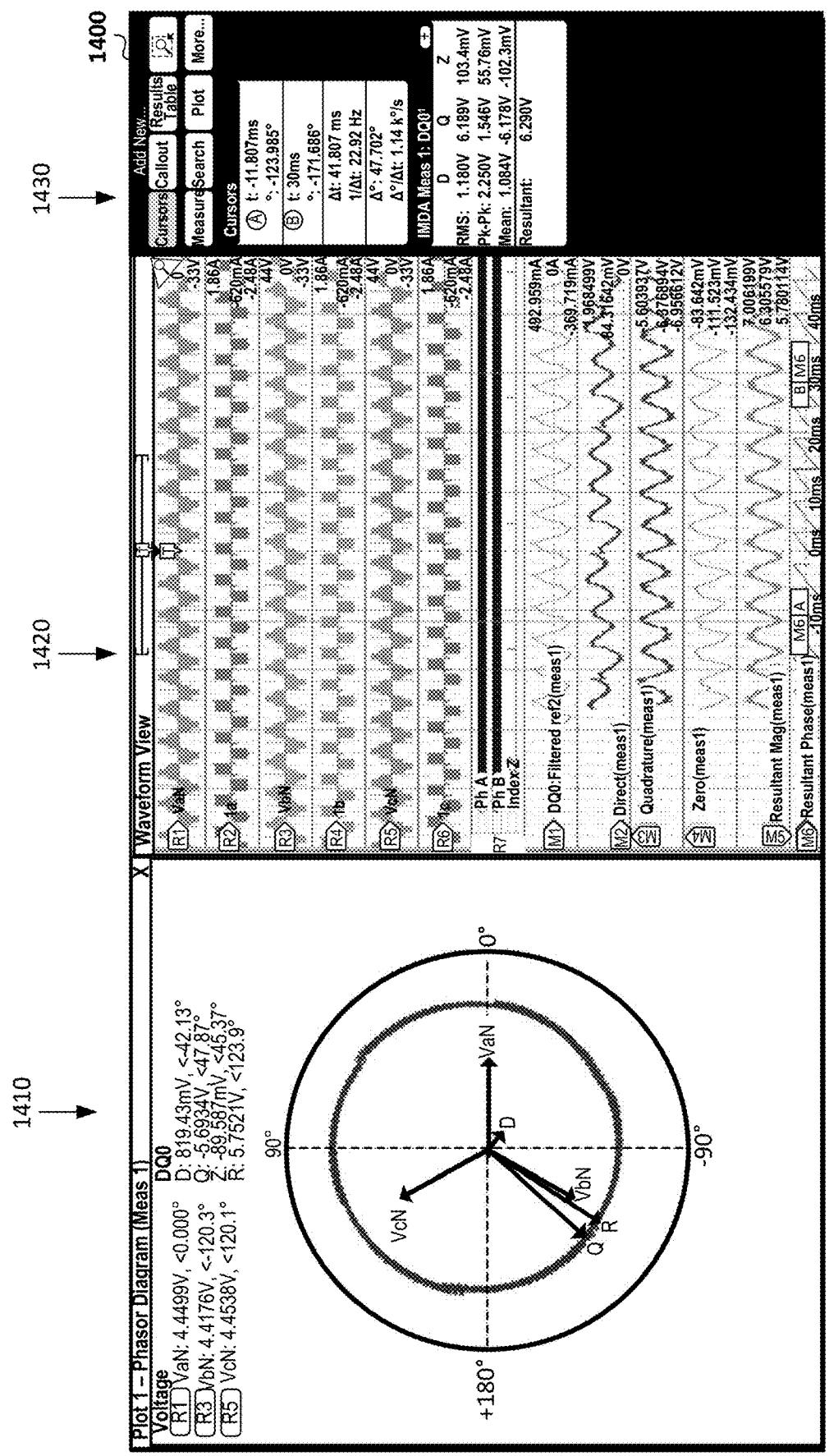

FIGS. 14A and 14B illustrate an ability for the user to scroll through historical data of the DQ0-R diagrams using cursors or other controls of an instrument. In this embodiment, consider that embodiments of the disclosure have gathered hundreds, thousands, or even more samples of data regarding the motor operation and stored the data in a storage memory. As the system was gathering data, the DQ0-R phasor diagram and other data described with reference to FIG. 13 are displayed in real-time on a display 1400, as the system operates. The display 1400 includes the same three main sections as the sections of the display 1300, i.e., a phasor diagram 1410, three-phase signals in section 1420, and scalar information in section 1430. Embodiments of the invention provide cursors that the user may utilize to traverse through the previous data points, in an acquisition stop mode. In other words, after new data samples have been halted, the historical data remains displayed on the phasor diagram 1410, such as that illustrated in FIG. 14A. By turning on cursor control on the instrument, one of the cursors is linked to the DQ0 as well as the $R_{DQ}$ vectors. Then, the user may use the cursors to traverse through the waveform, such as by using a scroll wheel of a computer mouse, or by turning an input knob on a device showing the screen. When traversing the waveform, the D, Q, and $R_{DQ}$ vectors for the sample points selected by the user are shown on the plot, based on the time position of the cursor, such as in FIG. 14B. In this way, the values of D, Q and $R_{DQ}$ at different time points can be highlighted and analyzed, and also helps the user visualize the rotating frame of the DQ0-R.

Figure 15:
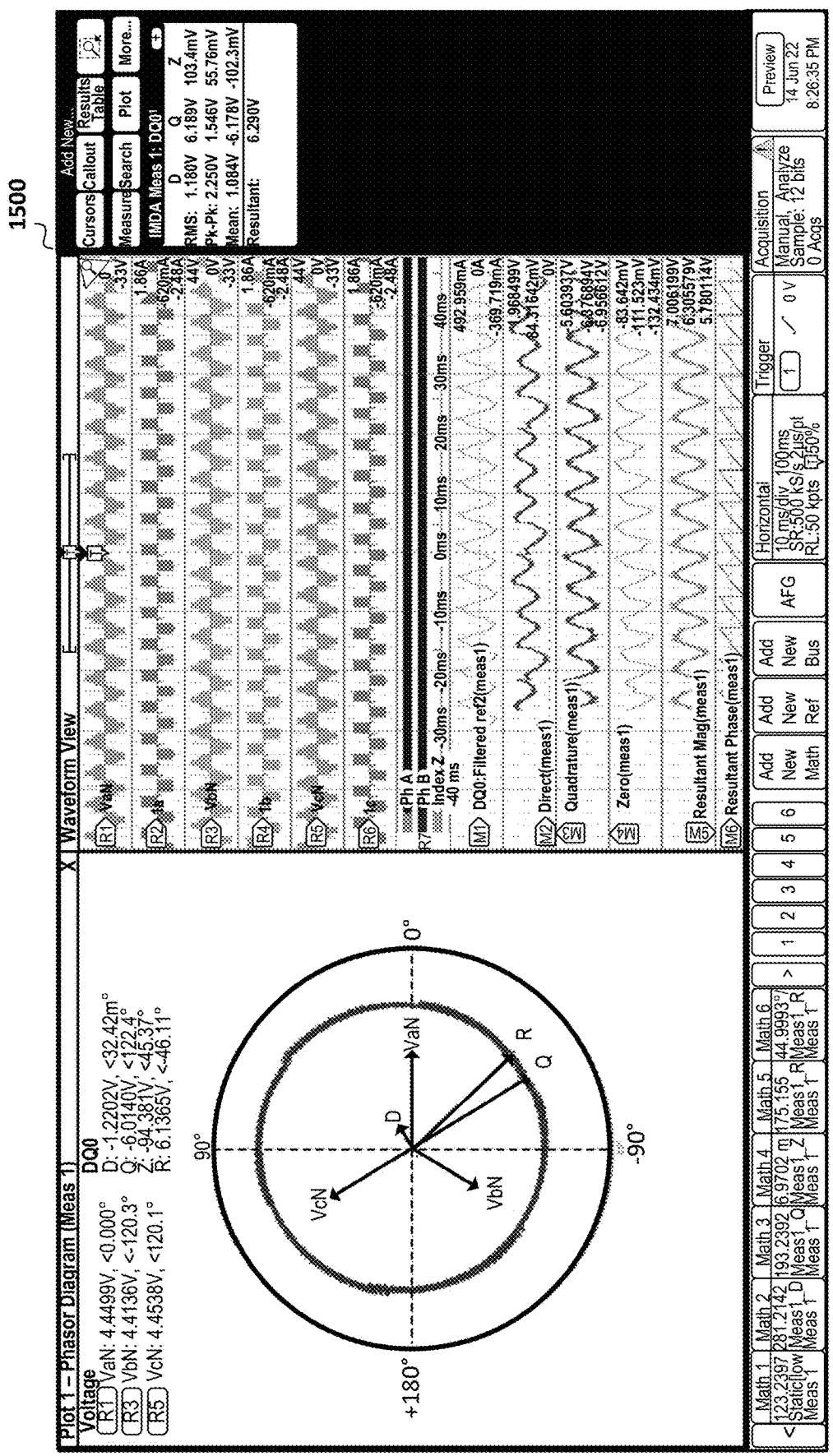

FIG. 15 illustrates a display 1500 showing actual results of a system built and operating according to embodiments of the invention.

FIG. 16 illustrates a display 1600 of scalar, i.e., non-graphical, data results of the D, Q, and $R_{DQ}$ vectors. The display 1600 may be an example of the blocks 1330 and 1430 of FIGS. 13, 14A, 14B, and may be included as a portion of the display 1500 of FIG. 15.

FIG. 17 is a block diagram of a test and measurement device 1700 upon which, or in which, embodiments of the invention may operate. A motor or other synchronous device 1780 is coupled to the test and measurement device through a probe interface 1710 or other type of interface that can receive signals from the motor 1780 for evaluation, measurement, and display. The probe interface may accept any of the signals described above, such as PWM signals from the driver 310 of FIG. 3, and any signal described with reference to the Hall sensors, QEI encoder, or Resolver described above. Typically, the probe interface 1710 may be one or more connectors to a cable. The probe interface 1710 includes appropriate circuitry (not shown) for acquiring the three-phase and other signals, which may include signal conditioning circuitry, analog-to-digital converters, memories, etc., as known to those of ordinary skill in the art. A processor/controller/processing element 1720 performs the DQ0 transformation on the acquired three-phase signals to produce DQ0 signals, as well as performs the mechanical-to-electrical processing described with reference to FIG. 3. Further, the processor 1720 generates the resultant $R_{DQ}$ vector from the D and Q vectors. The processor 1720 uses the DQ0 and $R_{DQ}$ signals to measure performance of the device under test. The device 1700 may also include a memory 1730 for storing both instructions executed by the processor 1720 to cause it to perform the transformations, generate the vectors, and for storing data. The device 1700 also includes a display 1740 to allow the device to display the data, in various forms, as discussed above. The device 1700 also includes a user interface 1750 for receiving configuration settings from a user and for accepting operational controls. For example, the device may receive from a user, through the user interface 1750, a selection of a method to be used for computing the vectors, specifying mask values, and inputting variance data as discussed above. Examples of input screens through which the user can input setup and control values are described with reference to FIGS. 18 and 19 below. Further, the user interface 1750 provides the cursor controls to the user for scrolling through the stored data, as described above. FIGS. 18A, 18B, and 19 illustrate various setup screens through which the user may configure the testing system. These screens may be received to the device 1700 through the user interface 1750. FIG. 18A illustrates various source setup configurations, such as measurement channels that provide three-phase current or voltage signals the motor. Additionally, the mechanical sensor type, such as QEI, Hall sensor, or Resolver may also be selected through this setup screen, as well as other system parameters. FIG. 18B illustrates another setup screen through which the testing system may be configured. FIG. 19 illustrates how a user can select values for the inner mask and outer mask, described above.

Embodiments of the invention offer several advantages over previous systems, some of which have been described above. Additional advantages include better alignment of the DQ0 plot compared to the actual rotor angular position. In the new approach, using mechanical sensor data in addition to electrical data, the rotor angular position from sensor data that is using a Hall sensor or the QEI encoder with an index pulse output is integrated with the DQ0 measurement. This mechanical angle is converted to electrical angle and used for the DQ0 matrix transformation. Further, rotor angle integration is important to get the D-axis aligned with the zero-degree permanent magnet of the rotor. This is achieved with Hall sensors, or with QEI methods. An option to give mechanical, i.e., measured rotor position, feedback along with electrical input is given in the configuration of the measurement.

EXAMPLES

Illustrative examples of the disclosed technologies are provided below. An embodiment of the technologies may include one or more, and any combination of, the examples described below.

Example 1 is a test and measurement instrument, including one or more sensors configured to measure a mechanical position of a synchronous machine driven by analog three-phase signals, a converter to determine an instantaneous electrical angle from the measured mechanical position, a transform configured to generate DQ0 signals based on the instantaneous electrical angle, and a vector generator structured to produce a resultant vector from the DQ0 signals.

Example 2 is a test and measurement instrument according to Example 1, further comprising a display structured to present a visual representation of the generated DQ0 signals and the resultant vector.

Example 3 is a test and measurement instrument according to Example 2, in which the generated DQ0 signals and the resultant vector are illustrated in a phasor diagram.

Example 4 is a test and measurement instrument according to Example 2, in which the generated DQ0 signals and the resultant vector are illustrated as scalar values.

Example 5 is a test and measurement instrument according to any of the preceding Examples, further comprising a memory for storing a set of sample data from the synchronous machine, and in which in which instrument includes a user interface structured to allow a user to select a particular data sample from the set of sample data.

Example 6 is a test and measurement instrument according to Example 5, in which the user selects the particular data sample based on controlling a cursor function of the instrument.

Example 7 is a test and measurement instrument according to any of the preceding Examples, further comprising a display, and in which the instrument presents the DQ0 signals and the resultant vector of the selected data sample in a phasor diagram on the display.

Example 8 is a test and measurement instrument according to any of the preceding Examples, in which the one or more sensors for measuring the mechanical position include a Hall sensor, a QEI sensor, or a resolver.

Example 9 is a test and measurement instrument according to any of the preceding Examples, further comprising an offset receiver for receiving misalignment information.

Example 10 is a test and measurement instrument according to any of the preceding Examples, further including a user interface that allows a user to select a mask value related to an expected value of the resultant vector.

Example 11 is a test and measurement instrument according to Example 10, further comprising a display structured to present a visual representation of the generated DQ0 signals and the resultant vector, and in which violations of the mask value are represented on the display.

Example 12 is a test and measurement instrument according to any of the preceding Examples, further comprising a low pass filter through which signals may be passed prior to generating the DQ0 signals.

Example 13 is a test and measurement instrument, including one or more inputs configured to receive driving signals for a synchronous machine driven by analog three-phase signals, an offset receiver for receiving an offset angle specification, a transform configured to generate DQ0 signals based on the received driving signals and the offset angle specification, and a vector generator structured to produce a resultant vector from the DQ0 signals.

Example 14 is a test and measurement instrument according to Example 13, further comprising a display structured to present a visual representation of the generated DQ0 signals and the resultant vector in a phasor diagram.

Example 15 is a method in a test and measurement instrument, including measuring a mechanical position of a synchronous machine driven by analog three-phase signals, determining an instantaneous electrical angle from the measured mechanical position, generating DQ0 signals based on the instantaneous electrical angle using a transform, and producing a resultant vector from the DQ0 signals.

Example 16 is a method according to Example 15, further comprising presenting a visual representation of the generated DQ0 signals and the resultant vector on a display.

Example 17 is a method according to any of the preceding Example methods, in which presenting a visual representation of the generated DQ0 signals and the resultant vector comprises presenting a phasor diagram.

Example 18 is a method according to any of the preceding Example methods, in which presenting a visual representation of the generated DQ0 and the resultant vector signals comprises presenting a display of scalar values.

Example 19 is a method according to any of the preceding Example methods, further comprising storing a set of sample data from the synchronous machine in a memory, and accepting a selected data sample from the set of sample data from a user.

Example 20 is a method according to Example method 19, in which accepting a selected data sample comprises receiving cursor information controlled by the user.

Example 21 is a method according to any of the preceding Example methods, further comprising presenting the DQ0 signals and the resultant vector of the selected data sample in a phasor diagram.

Example 22 is a method according to any of the preceding Example methods, in which measuring a mechanical position of a synchronous machine comprises using one or more of a Hall sensor, a QEI sensor, or a resolver.

Example 23 is a method according to Example method 22, further comprising receiving offset angle misalignment information for the Hall sensor, the QEI sensor, or the resolver.

Example 23 is a method according to any of the preceding Example methods, further comprising receiving a selected mask value related to an expected value of the resultant vector from a user.

Example 24 is a method according to Example method 23, further comprising presenting violations of the selected mask values by the resultant vector.

Example 25 is a method according to any of the preceding Example methods, further comprising performing low pass filtering on any of the three-phase signals or signals generated while measuring the mechanical position of the synchronous machine.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument, comprising:
   one or more sensors configured to measure a mechanical position of a synchronous machine driven by analog three-phase signals;
   a converter to determine an instantaneous electrical angle from the measured mechanical position;
   a transform configured to generate DQ0 signals based on the instantaneous electrical angle; and
   a vector generator structured to produce a resultant vector from the DQ0 signals.

2. The test and measurement instrument according to claim 1, further comprising a display structured to present a visual representation of the generated DQ0 signals and the resultant vector to a user of the test and measurement instrument.

3. The test and measurement instrument according to claim 2, in which the generated DQ0 signals and the resultant vector are illustrated in a phasor diagram.

4. The test and measurement instrument according to claim 2, in which the generated DQ0 signals and the resultant vector are illustrated as scalar values.

5. The test and measurement instrument according to claim 1, further comprising a memory for storing a set of sample data from the synchronous machine, and in which instrument includes a user interface structured to allow a user to select a particular data sample from the set of sample data.

6. The test and measurement instrument according to claim 5, in which the user selects the particular data sample based on controlling a cursor function of the instrument.

7. The test and measurement instrument according to claim 5, further comprising a display, and in which the instrument presents the DQ0 signals and the resultant vector of the selected data sample in a phasor diagram on the display.

8. The test and measurement instrument according to claim 1, in which the one or more sensors for measuring the mechanical position include a Hall sensor, a QEI sensor, or a resolver.

9. The test and measurement instrument according to claim 8, further comprising an offset receiver for receiving misalignment information, in which the misalignment information relates to an angle error of the one or more sensors.

10. The test and measurement instrument according to claim 1, further including a user interface that allows a user to select a mask value related to an expected value of the resultant vector.

11. The test and measurement instrument according to claim 10, further comprising a display structured to present a visual representation of the generated DQ0 signals and the resultant vector, and in which violations of the mask value are represented on the display.

12. The test and measurement instrument according to claim 1, further comprising a low pass filter through which signals may be passed prior to generating the DQ0 signals.

13. A test and measurement instrument, comprising:
one or more inputs configured to receive driving signals for a synchronous machine driven by analog three-phase signals;
an offset receiver for receiving an offset angle specification;
a transform configured to generate DQ0 signals based on the received driving signals and the offset angle specification; and
a vector generator structured to produce a resultant vector from the DQ0 signals.

14. The test and measurement instrument according to claim 13, further comprising a display structured to present a visual representation of the generated DQ0 signals and the resultant vector in a phasor diagram to a user of the test and measurement instrument.

15. A method in a test and measurement instrument, comprising:
measuring a mechanical position of a synchronous machine driven by analog three-phase signals;
determining an instantaneous electrical angle from the measured mechanical position;
generating DQ0 signals based on the instantaneous electrical angle using a transform; and
producing a resultant vector from the DQ0 signals.

16. The method according to claim 15, further comprising presenting a visual representation of the generated DQ0 signals and the resultant vector to a user of the test and measurement instrument on a display of the test and measurement instrument.

17. The method according to claim 15, in which presenting a visual representation of the generated DQ0 signals and the resultant vector comprises presenting a phasor diagram.

18. The method according to claim 15, in which presenting a visual representation of the generated DQ0 and the resultant vector signals comprises presenting a display of scalar values.

19. The method according to claim 15, further comprising storing a set of sample data from the synchronous machine in a memory, and accepting a selected data sample from the set of sample data from a user.

20. The method according to claim 19, in which accepting a selected data sample comprises receiving cursor information controlled by the user.

21. The method according to claim 15, further comprising presenting the DQ0signals and the resultant vector of the selected data sample in a phasor diagram.

22. The method according to claim 15, in which measuring a mechanical position of a synchronous machine comprises using one or more of a Hall sensor, a QEI sensor, or a resolver.

23. The method according to claim 22, further comprising receiving offset angle misalignment information for the Hall sensor, the QEI sensor, or the resolver.

24. The method according to claim 15, further comprising receiving a selected mask value related to an expected value of the resultant vector from a user.

25. The method according to claim 24, further comprising presenting violations of the selected mask values by the resultant vector.

26. The method according to claim 15, further comprising performing low pass filtering on any of the three-phase signals or signals generated while measuring the mechanical position of the synchronous machine.

* * * * *